(12) United States Patent
Harasaka et al.

(10) Patent No.: US 8,035,676 B2
(45) Date of Patent: *Oct. 11, 2011

(54) SURFACE EMITTING LASER ELEMENT, SURFACE EMITTING LASER ARRAY, OPTICAL SCANNING DEVICE, AND IMAGE FORMING APPARATUS

(75) Inventors: Kazuhiro Harasaka, Miyagi (JP); Shunichi Sato, Miyagi (JP); Naoto Jikutani, Miyagi (JP); Toshihiro Ishii, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 52 days.

This patent is subject to a terminal disclaimer.

(21) Appl. No.: 12/432,872

(22) Filed: Apr. 30, 2009

(65) Prior Publication Data
US 2009/0285602 A1  Nov. 19, 2009

(30) Foreign Application Priority Data

May 15, 2008 (JP) .................................. 2008-128303
Mar. 30, 2009 (JP) .................................. 2009-081664

(51) Int. Cl.
  *B41J 2/45* (2006.01)
  *H01S 5/00* (2006.01)
(52) U.S. Cl. .................. 347/238; 372/44.011; 372/50.11
(58) Field of Classification Search .................. 347/238, 347/233; 372/43.01–44.011, 45.01, 46.013, 372/50.11, 50.124
See application file for complete search history.

(56) References Cited

U.S. PATENT DOCUMENTS

| 5,727,014 A * | 3/1998 | Wang et al. ........................ 372/96 |
| 6,411,638 B1 | 6/2002 | Johnson et al. |
| 7,542,499 B2 * | 6/2009 | Jikutani ........................ 372/46.013 |
| 2006/0187997 A1 | 8/2006 | Ezaki et al. |
| 2007/0014324 A1 | 1/2007 | Maeda et al. |
| 2008/0212636 A1 * | 9/2008 | Sato et al. ................... 372/50.11 |
| 2009/0262770 A1 * | 10/2009 | Itoh et al. ................... 372/44.011 |

(Continued)

FOREIGN PATENT DOCUMENTS

EP  1780849 A1  5/2007

(Continued)

OTHER PUBLICATIONS

Ohtoshi, T., et al., "Dependence of optical gain on crystal orientation in surface-emitting lasers with strained quantum wells", *Appl. Phys. Lett.*, vol. 65, No. 15, pp. 1886-1887, Oct. 10, 1994.

(Continued)

*Primary Examiner* — Hai Pham
(74) *Attorney, Agent, or Firm* — Cooper & Dunham LLP

(57) ABSTRACT

In a surface emitting laser element, on a substrate whose normal direction of a principal surface is inclined, a resonator structural body including an active layer, and a lower semiconductor DBR and an upper semiconductor DBR sandwiching the resonator structural body are stacked. A shape of a current passing through region in an oxide confinement structure of the upper semiconductor DBR is symmetrical to an axis passing through a center of the current passing through region parallel to an X axis and symmetrical to an axis passing through the center of the current passing through region parallel to a Y axis, and a length of the current passing through region is greater in the Y axis direction than in the X axis direction. A thickness of an oxidized layer surrounding the current passing through region is greater in the −Y direction than in the +X and −X directions.

14 Claims, 23 Drawing Sheets

U.S. PATENT DOCUMENTS

2009/0310632 A1* 12/2009 Sugawara et al. ............... 372/24
2010/0118907 A1 5/2010 Sato et al.

FOREIGN PATENT DOCUMENTS

| | | |
|---|---|---|
| JP | 9-172218 | 6/1997 |
| JP | 2891133 | 2/1999 |
| JP | 2005-340779 | 12/2005 |
| JP | 3762765 | 1/2006 |
| JP | 4010095 | 9/2007 |
| JP | 2007-318086 | 12/2007 |
| JP | 2008-28424 | 2/2008 |
| JP | 2008-78612 | 4/2008 |

OTHER PUBLICATIONS

Jan. 11, 2011 European search report in connection with counterpart European patent application No. 09 25 1292.

* cited by examiner

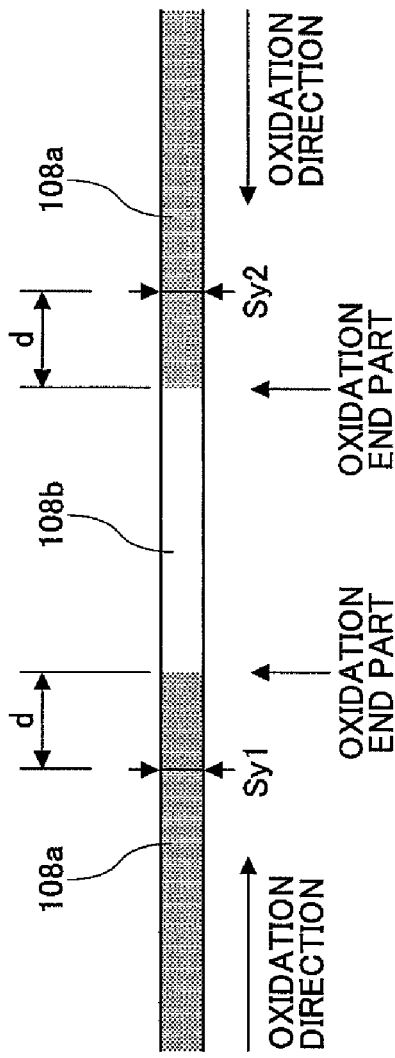
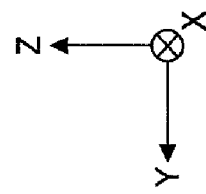
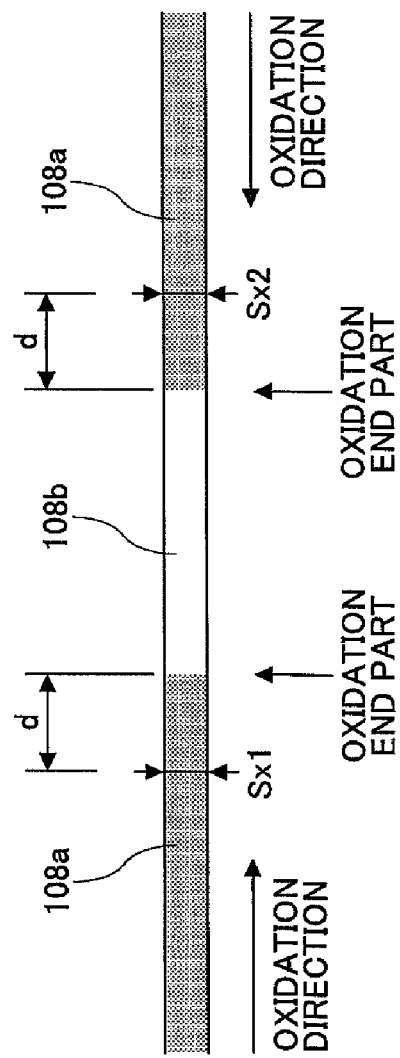
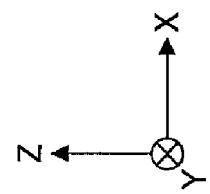

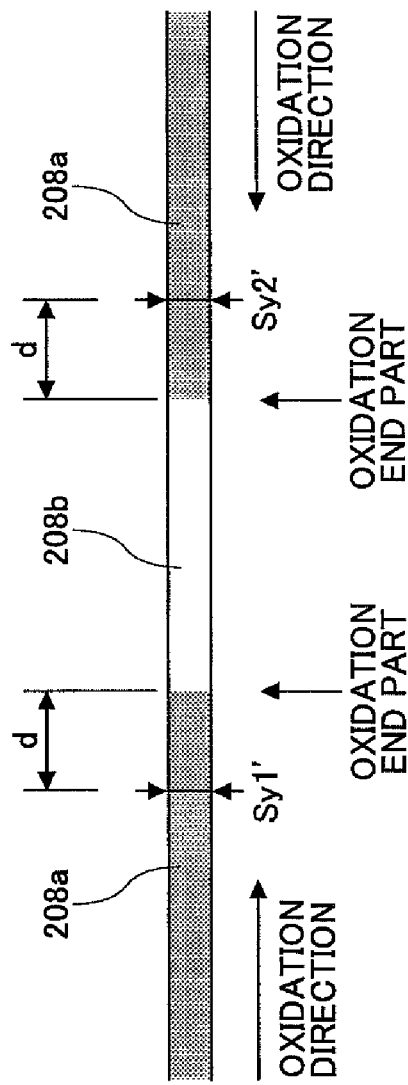
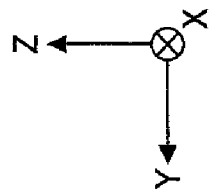
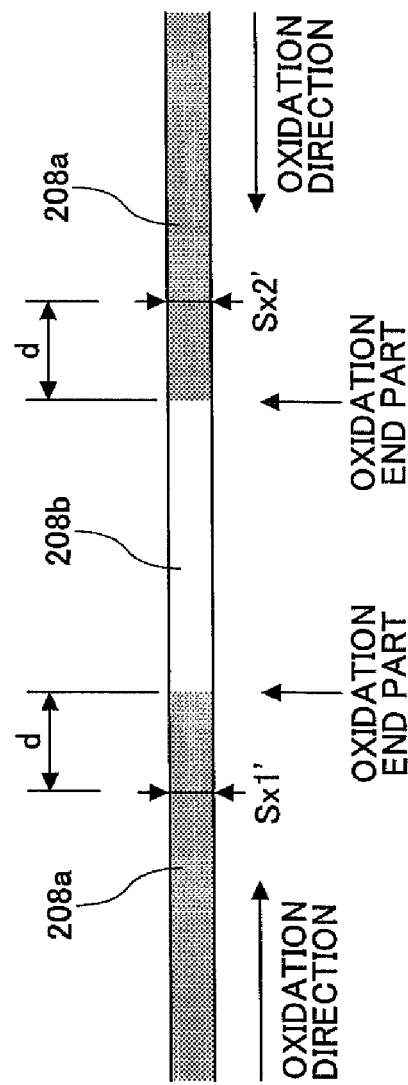
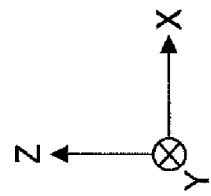

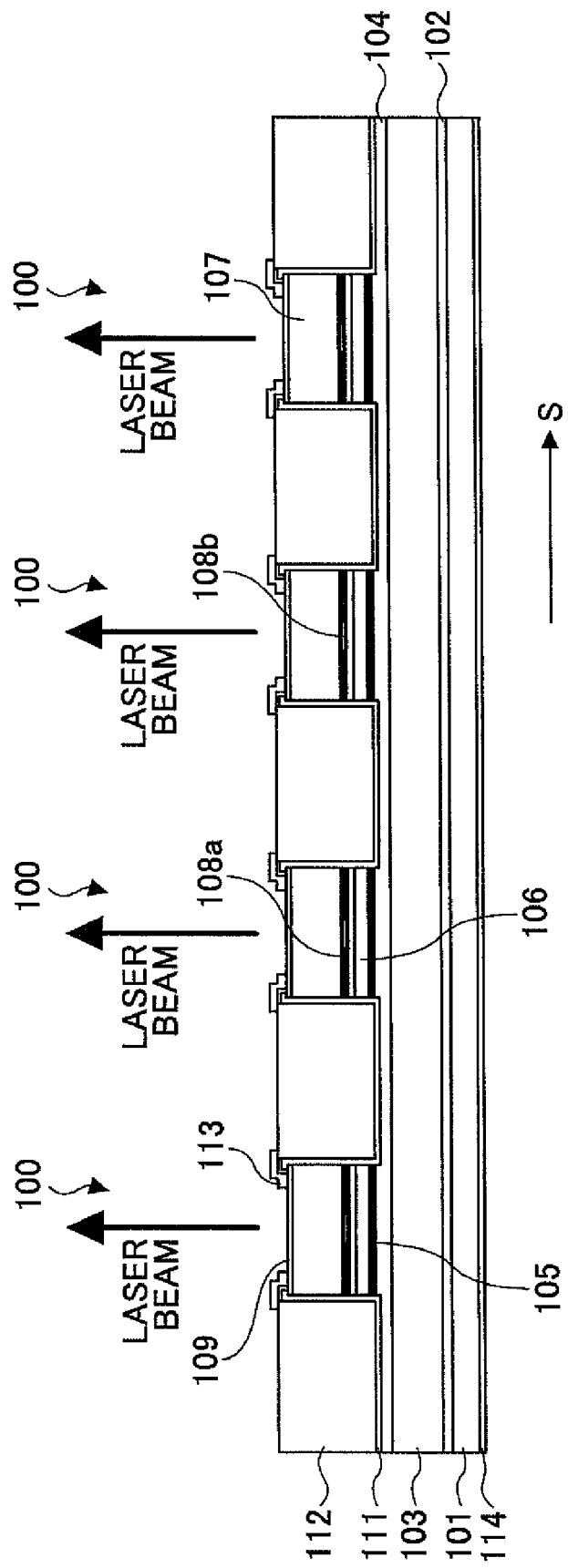

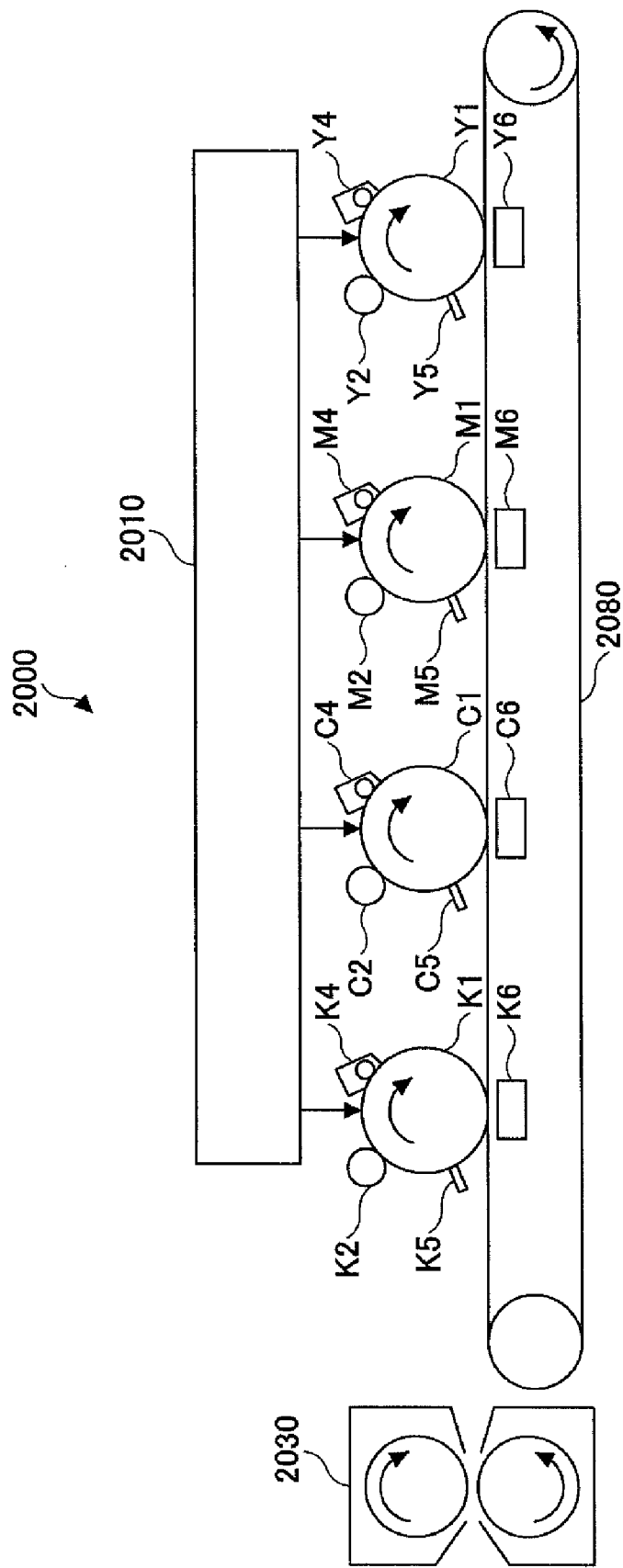

SURFACE EMITTING LASER ELEMENT, SURFACE EMITTING LASER ARRAY, OPTICAL SCANNING DEVICE, AND IMAGE FORMING APPARATUS

BACKGROUND

1. Technical Field

This disclosure generally relates to a surface emitting laser element which emits laser beams in a direction perpendicular to a surface of a substrate of the surface emitting laser element, a surface emitting laser array in which the surface emitting laser elements are arrayed, an optical scanning device using the surface emitting laser element or the surface emitting laser array, and an image forming apparatus using the optical scanning device.

2. Description of the Related Art

A VCSEL (vertical cavity surface emitting laser) emits laser beams in a direction perpendicular to a surface of a substrate of the VCSEL and has low cost, low current consumption, a small size, and high efficiency, and is suitable for a two-dimensional device, when the VCSEL is compared with an edge emitting laser. Therefore, the VCSEL has been greatly researched.

As application fields of the VCSEL, there are a light source of an optical writing system of a printer (oscillation wavelength is in a 780 nm band), a writing light source of an optical disk device (oscillation wavelength is in a 780 nm band and a 850 nm band), a light source of an optical transmission system using an optical fiber, for example, a LAN (local area network) (oscillation wavelength is in a 1.3 µm band and a 1.5 µm band). In addition, the VCSEL has been expected to be used as a light source between boards, inside the board, between chips in an LSI (large scale integration), and inside the LSI.

In the application fields of the VCSEL, in many cases, a laser beam output from the VCSEL (hereinafter in some cases referred to as an output laser beam) is required to be that a polarization mode of the output laser beam is constant and a cross sectional shape of the output laser beam is a circle.

With respect to control of the polarization mode, in manufacturing of a VCSEL using a substrate (non-inclined substrate) whose principal surface is a (100) surface, a current passing through region (current channel region) has an anisotropic shape (for example, see Patent Documents 1 though 3).

In addition, the polarization mode is controlled by using a so-called inclined substrate (see Patent Document 4 and Non-Patent Document 1).

Further, with respect to the cross sectional shape of the output laser beam, the shape of the current passing through region is determined to be a circle or a square by adjusting a column shape (mesa shape) of a resonator structural body (see Patent Document 5).

However, when the current passing through region has the anisotropic shape, it is difficult for the cross sectional shape of the output laser beam to be a circle. In addition, when an inclined substrate is simply used, the shape of the current passing through region becomes asymmetrical (see FIG. 27A), and it is difficult for the cross sectional shape of the output laser beam to be a circle. In FIG. 27B, a current passing through region whose shape is symmetrical for two axes is shown.

[Patent Document 1] Japanese Unexamined Patent Publication No. H9-172218

[Patent Document 2] Japanese Patent No. 2891133

[Patent Document 3] Japanese Unexamined Patent Publication No. 2008-28424

[Patent Document 4] Japanese Patent No. 4010095

[Patent Document 5] Japanese Patent No. 3762765

[Non-Patent Document 1] T. Ohtoshi, T. Kuroda, A. Niwa, and S. Tsuji "Dependence of optical gain on crystal orientation in surface emitting lasers with strained quantum wells", Appl. Phys. Lett. 65(15), pp. 1886-1877, 1994

The inventors of the present invention have studied a relationship between a shape of a current passing through region, and a polarization suppression ratio and a radiation angle of an output laser beam in detail by manufacturing a surface emitting laser element having an inclined substrate. Then, the inventors have newly found the following. That is, in some cases, it is difficult for a cross sectional shape of an output laser beam to be a circle, by only causing the shape of the current passing through region to be a circle or a square.

The inventors have studied the reasons of the above results in detail and have newly found that the thickness of an oxide surrounding the current passing through region greatly influences the radiation angle of the output laser beam when an inclined substrate is used.

BRIEF SUMMARY

In an aspect of this disclosure, there is provided a surface emitting laser element which emits laser beams in a direction perpendicular to a surface of a substrate of the surface emitting laser element, a surface emitting laser array in which the surface emitting laser elements are arrayed, an optical scanning device using the surface emitting laser element or the surface emitting laser array, and an image forming apparatus using the optical scanning device, in which stability in a polarization direction of the output laser beams can be obtained without causing high cost and a cross sectional shape of output laser beams can be approximately a circle.

In another aspect, there are provided a surface emitting laser element which emits laser beams in a direction perpendicular to a surface of a substrate of the surface emitting laser element, a surface emitting laser array in which the surface emitting laser elements are arrayed, an optical scanning device using the surface emitting laser element or the surface emitting laser array, and an image forming apparatus using the optical scanning device.

In another aspect of this disclosure, there is provided a surface emitting laser element which emits a laser beam in a direction perpendicular to a surface of a substrate of the surface emitting laser element. The surface emitting laser element includes the substrate whose normal direction of a principal surface is inclined to one direction of a [1 1 1] crystal orientation relative to one direction of a [1 0 0] crystal orientation, a resonator structural body including an active layer, first and second semiconductor distributed Bragg reflectors which sandwich the resonator structural body and include a confinement structure in which a current passing through region is surrounded by an oxidized layer formed by oxidizing a part of a layer to be selectively oxidized containing at least aluminum, and plural semiconductor layers stacked on the substrate. A shape of the current passing through region is symmetrical to a first axis which is orthogonal to one direction of the [1 0 0 ] crystal orientation and one direction of the [1 1 1] crystal orientation, is parallel to the surface of the substrate, and passes through a center of the current passing through region, and is symmetrical to a second axis which is orthogonal to the normal direction and the first axis and passes through the center of the current passing through region, a length of the current passing through region in the first axis direction is different from a length in the second axis direction, a thickness of the oxidized layer surrounding the current passing through region is different between in a direction parallel to the second axis direction and in a direction parallel to the first axis direction, and a radiation angle of the laser beam in the first axis direction is the same as a direction of the laser beam in the second axis direction.

BRIEF DESCRIPTION OF THE DRAWINGS

Features The aforementioned and other aspects, features and advantages will become more apparent from the following detailed description when read in conjunction with the accompanying drawings, in which:

FIG. 7 is a cut-away side view of an oxide confinement structure shown in FIG. 6 along line A-A of FIG. 6;

FIG. 8 is a cut-away side view of the oxide confinement structure shown in FIG. 6 along line B-B of FIG. 6;

FIG. 14 is a cut-away side view of an oxide confinement structure shown in FIG. 13 along line A-A of FIG. 13;

FIG. 15 is a cut-away side view of the oxide confinement structure shown in FIG. 13 along line B-B of FIG. 13;

FIG. 25 is a cut-away side view along line A-A of FIG. 24;

FIG. 26 is a cut-away side view of a color printer;

DESCRIPTION OF THE PREFERRED EMBODIMENT

Best Mode of Carrying Out the Invention

The best mode of carrying out the present invention is described with reference to the accompanying drawings.

Referring to FIGS. 1 through 11, an embodiment of the present invention is described.

Figure 1:
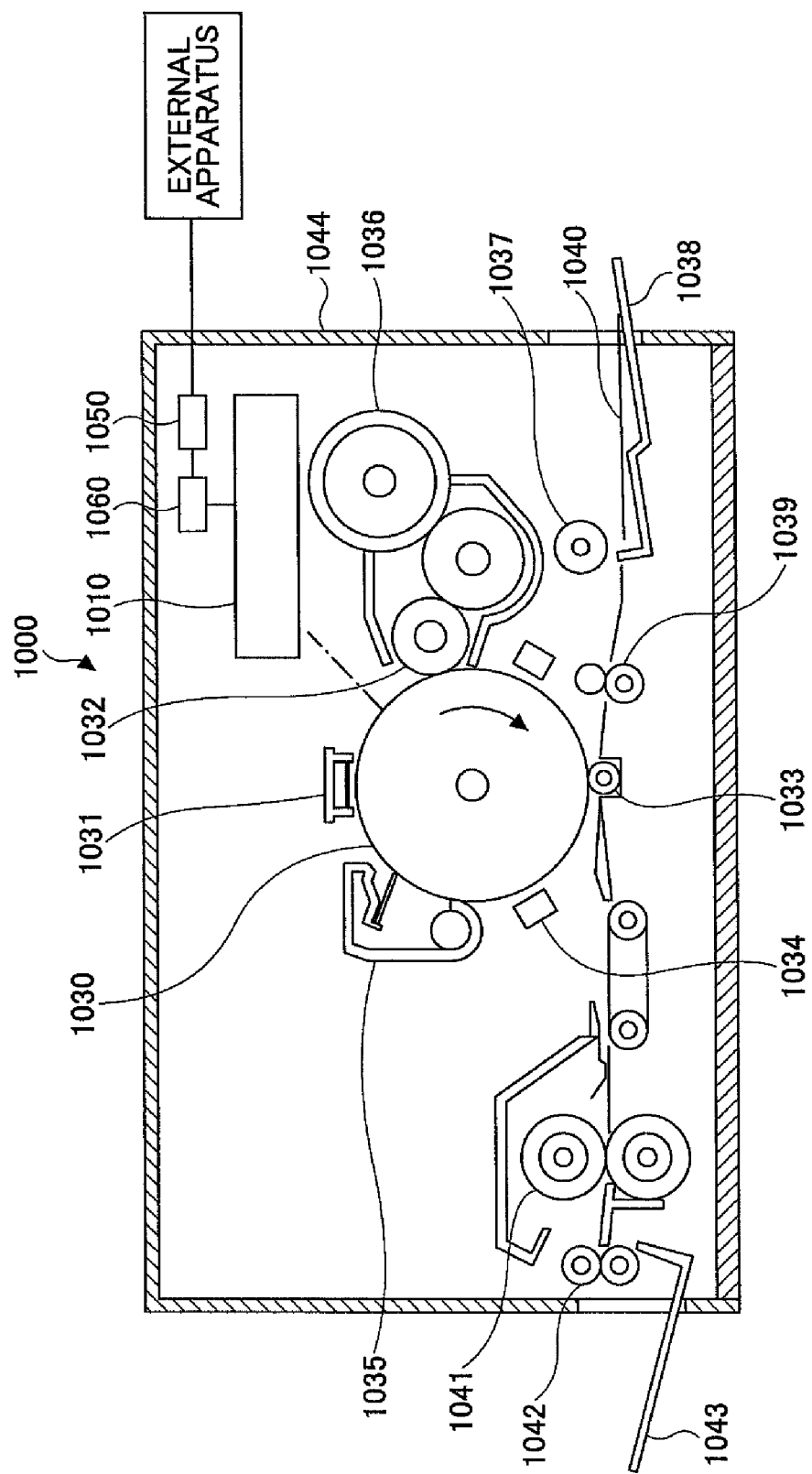
FIG. 1 is a cut-away side view of an image forming apparatus according to an embodiment of the present invention.

FIG. 1 is a cut-away side view of an image forming apparatus according to the embodiment of the present invention. In FIG. 1, as the image forming apparatus, a laser printer 1000 is shown.

As shown in FIG. 1, the laser printer 1000 includes an optical scanning device 1010, a photoconductor drum 1030, a charger 1031, a developing roller 1032, a transfer charger 1033, a discharging unit 1034, a cleaning unit 1035, a toner cartridge 1036, a paper feeding roller 1037, a paper feeding tray 1038, a pair of registration rollers 1039, fixing rollers 1041, paper outputting rollers 1042, a paper outputting tray 1043, a communication controller 1050, and a printer controller 1060 for totally controlling the above elements at corresponding predetermined positions in a printer cabinet 1044.

The communication controller 1050 controls interactive communications with an external apparatus (for example, a personal computer) via, for example, a network.

The photoconductor drum 1030 (image carrier) is a cylinder-shaped member and a photoconductor layer is formed on the surface of the photoconductor drum 1030. That is, the surface of the photoconductor drum 1030 is a surface to be scanned. The photoconductor drum 1030 is rotated in the arrow direction shown in FIG. 1.

The charger 1031, the developing roller 1032, the transfer charger 1033, the discharging unit 1034, and the cleaning unit 1035 are disposed near the surface of the photoconductor drum 1030. The charger 1031, the developing roller 1032, the transfer charger 1033, the discharging unit 1034, and the cleaning unit 1035 are sequentially disposed along the rotation direction of the photoconductor drum 1030 in this order.

The charger 1031 uniformly charges the surface of the photoconductor drum 1030.

The optical scanning device 1010 radiates a light flux (laser beam) modulated based on image information transmitted from the external apparatus onto the surface of the photoconductor drum 1030 charged by the charger 1031. With this, an electrostatic latent image based on the image information is formed onto the surface of the photoconductor drum 1030. The formed electrostatic latent image is moved to the developing roller 1032 corresponding to the rotation of the photoconductor drum 1030. The optical scanning device 1010 is described below in detail.

Toners are stored in the toner cartridge 1036 and the stored toners are supplied to the developing roller 1032.

The developing roller 1032 adheres the toners supplied from the toner cartridge 1036 onto the electrostatic latent image formed on the surface of the photoconductor drum 1030. With this, the electrostatic latent image is developed and the image information is caused to appear. The electrostatic latent image on which the toners are adhered (toner image) is moved to the transfer charger 1033 corresponding to the rotation of the photoconductor drum 1030.

Recording paper 1040 is stored in the paper feeding tray 1038. The paper feeding roller 1037 is disposed near the paper feeding tray 1038, the paper feeding roller 1037 picks up the recording paper 1040 one by one from the paper feeding tray 1038, and transports the picked up recording paper 1040 to the pair of the registration rollers 1039. The pair of the registration rollers 1039 temporarily holds the recording paper 1040 picked up by the paper feeding roller 1037 and transports the recording paper 1040 to a position (gap) between the photoconductor drum 1030 and the transfer charger 1033 corresponding to the rotation of the photoconductor drum 1030.

A voltage whose polarity is reverse to the polarity of the toners is applied onto the transfer charger 1033 so that the toner image on the photoconductor drum 1030 is electrically attracted onto the recording paper 1040. The toner image on the surface of the photoconductor drum 1030 is transferred onto the recording paper 1040 by the voltage. The recording paper 1040 onto which the toner image is transferred is transported to the fixing rollers 1041.

Heat and pressure are applied to the recording paper 1040 by the fixing rollers 1041. With this, the toner image on the recording paper 1040 is fixed. The recording paper 1040 on which the toner image is fixed by the fixing rollers 1041 is transported to the paper outputting tray 1043 via the paper outputting rollers 1042, and the recording paper 1040 is stacked on the paper outputting tray 1043.

The discharging unit 1034 discharges the surface of the photoconductor drum 1030.

The cleaning unit 1035 removes the toners remaining on the surface of the photoconductor drum 1030. The surface of the photoconductor drum 1030 on which the remaining toners are removed returns to a position to face the charger 1031.

Figure 2:
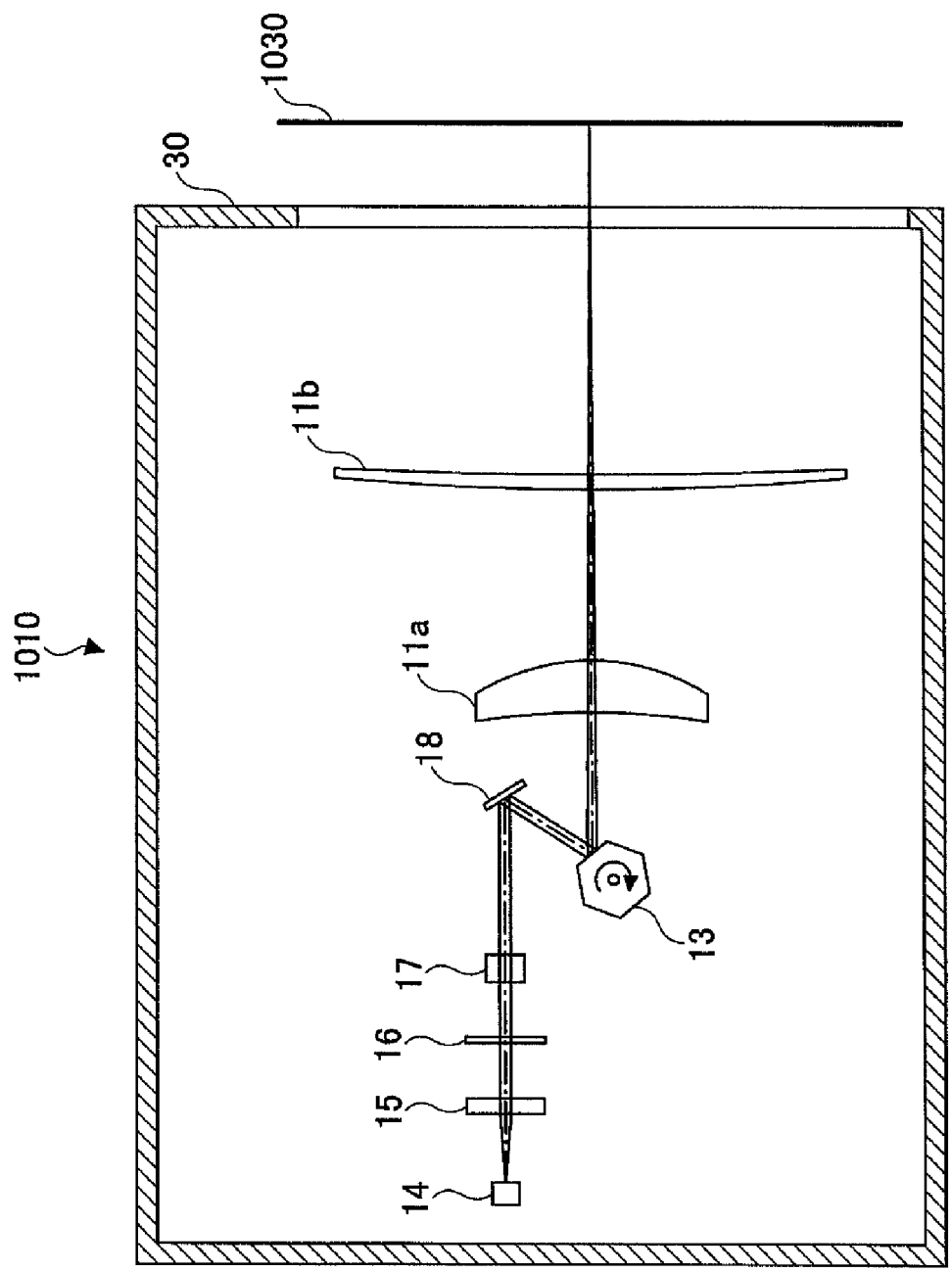
FIG. 2 is a cut-away side view of an optical scanning device shown in FIG. 1.

Next, a structure of the optical scanning device 1010 is described. FIG. 2 is a cut-away side view of the optical scanning device 1010.

As shown in FIG. 2, as an example, the optical scanning device 1010 includes a deflector side scanning lens 11*a*, an image face side scanning lens 11*b*, a polygon mirror 13, a light source 14, a coupling lens 15, an aperture plate 16, an anamorphic lens 17, a reflection mirror 18, and a scanning controller (not shown) at corresponding predetermined positions in housing 30.

In the following, the direction corresponding to the main scanning is called the main scanning corresponding direction and the direction corresponding to the sub scanning is called the sub scanning corresponding direction.

The coupling lens 15 causes the light flux output from the light source 14 to be approximately parallel light. The light source 14 and the coupling lens 15 are secured to a supporting member formed of aluminum and are integrated together.

The aperture plate 16 includes an aperture section and controls the beam diameter of the light flux sent from the coupling lens 15.

The anamorphic lens 17 forms an image near the deflection reflection surface of the polygon mirror 13 from the light flux passed through the aperture section of the aperture plate 16 via the reflection mirror 18 in the sub scanning corresponding direction.

An optical system disposed on an optical route between the light source 14 and the polygon mirror 13 is called an optical system before deflector. In the present embodiment, the optical system before deflector is formed of the coupling lens 15, the aperture plate 16, the anamorphic lens 17, and the reflection mirror 18.

The polygon mirror 13 (deflector) has a six-sided mirror whose inscribing circle radius is, for example, 18 mm and each mirror is a deflection reflection surface. The polygon mirror 13 rotates at a constant speed around an axle parallel to the sub scanning corresponding direction and deflects the light flux from the reflection mirror 18.

The deflector side scanning lens 11*a* is in the optical route of the light flux deflected by the polygon mirror 13.

The image face side scanning lens 11*b* is in the optical route from the deflector side scanning lens 11*a*. The light flux from the image face side scanning lens 11*b* is radiated onto the surface of the photoconductor drum 1030, and a light spot is formed on the surface of the photoconductor drum 1030. The light spot moves in the long length direction of the photoconductor drum 1030 corresponding to the rotation of the polygon mirror 13. That is, the light spot scans the surface of the photoconductor drum 1030. The moving direction of the light spot is the main scanning direction, and the rotation direction of the photoconductor drum 1030 is the sub scanning direction.

An optical system on an optical route between the polygon mirror 13 and the photoconductor drum 1030 is called a scanning optical system. In the present embodiment, the scanning optical system is formed of the deflector side scanning lens 11*a* and the image face side scanning lens 11*b*. In this, at least one optical axis folding mirror can be disposed on at least one of the optical route between the deflector side scanning lens 11*a* and the image face side scanning lens 11*b* and the optical route between the image face side scanning lens 11*b* and the photoconductor drum 1030.

Figure 3:
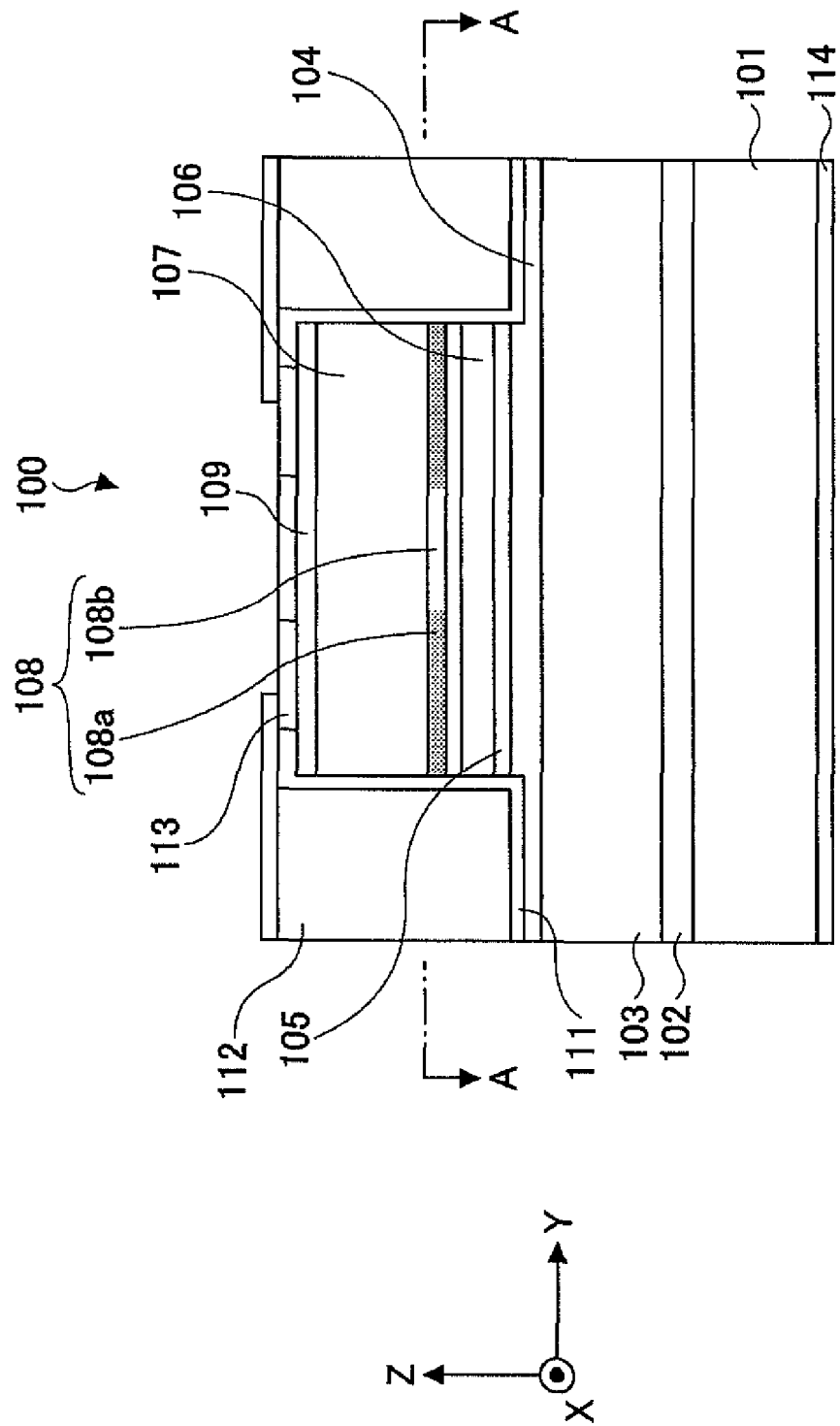
FIG. 3 is a cut-away side view of a surface emitting laser element according to the embodiment of the present invention.

FIG. 3 is a cut-away side view of a surface emitting laser element 100 according to the embodiment of the present invention. As an example, the light source 14 includes the surface emitting laser element 100 shown in FIG. 3.

In the description of the present invention, the laser beam (light flux) radiating direction is a Z axis direction, and two directions orthogonal to each other on a surface perpendicular to the Z axis direction are an X axis direction and a Y axis direction, respectively.

A designed oscillation wavelength of the surface emitting laser element 100 is in a 780 nm band. The surface emitting laser element 100 includes a substrate 101, a buffer layer 102, a lower semiconductor DBR (distributed Bragg reflector) 103, a lower spacer layer 104, an active layer 105, an upper spacer layer 106, an upper semiconductor DBR 107, a contact layer 109, and so on.

Figure 4A:
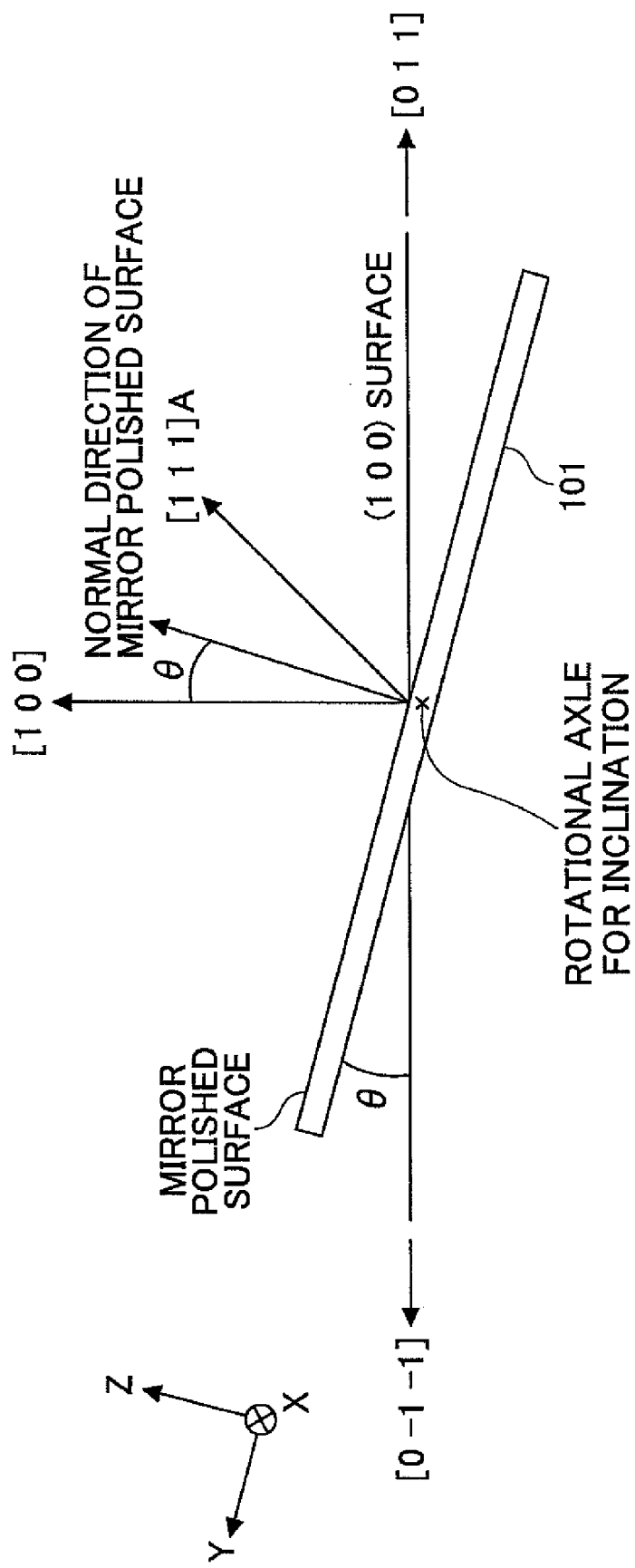
FIG. 4A is a diagram showing an inclination of a substrate shown in FIG. 3.
Figure 4B:
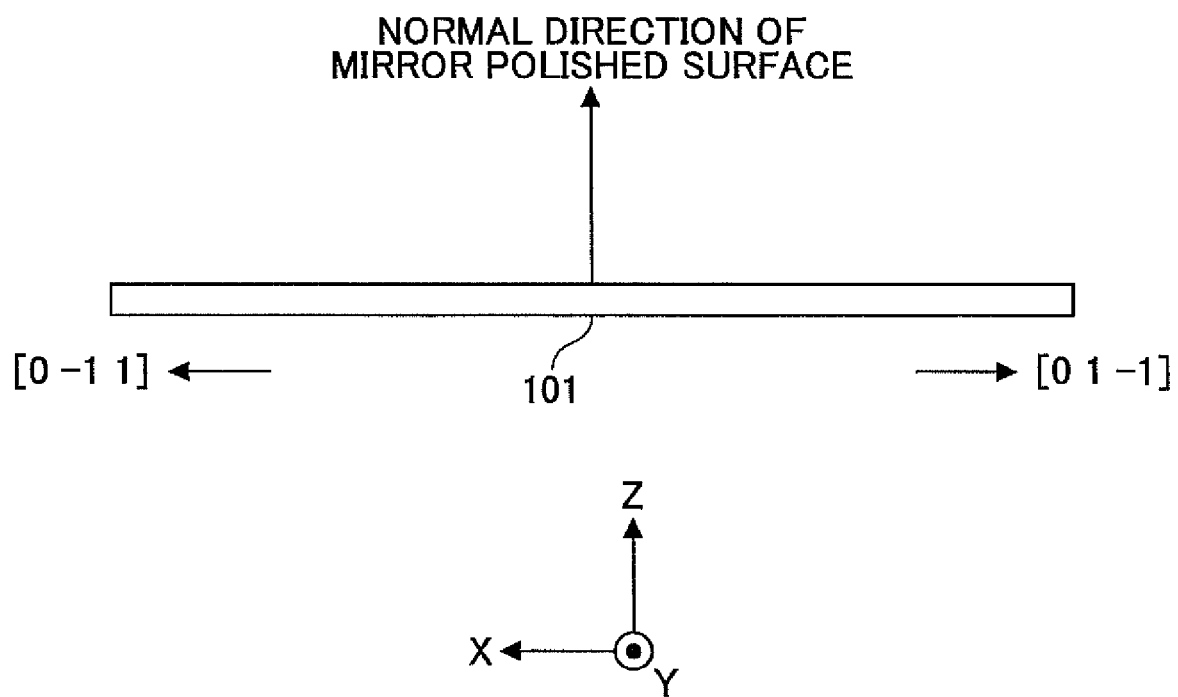
FIG. 4B is a diagram showing a position of the substrate shown in FIG. 3.

FIG. 4A is a diagram showing an inclination of the substrate 101. FIG. 4B is a diagram showing the position of the substrate 101.

The surface of the substrate 101 is a mirror polished surface, and the substrate 101 is an n-GaAs single crystal substrate. AS shown in FIG. 4A, the normal direction of the mirror polished surface (principal surface) of the substrate 101 is inclined by 15 degrees (θ=15 degrees) to the [1 1 1] crystal orientation A direction relative to the [1 0 0] crystal orientation direction. That is, the substrate 101 is a so-called inclined substrate. In this, as shown in FIG. 4B, the substrate 101 is disposed so that the [0 1 −1] crystal orientation direction is the −X direction, and the [0 −1 1] crystal orientation direction is the +X direction.

Returning to FIG. 3, the buffer layer 102 is stacked on a +Z side surface of the substrate 101 and is formed of n-GaAs.

The lower semiconductor DBR 103 is stacked at the +Z side of the buffer layer 102 and includes 40.5 pairs of a low refractive index layer formed of n-AlAs and a high refractive index layer formed of n-$Al_{0.3}Ga_{0.7}As$.

In addition, in order to decrease an electric resistance value, a composition gradient layer of 20 nm thickness is formed between the refractive index layers in which the composition is gradually changed from one composition to the other composition. Each of the refractive index layers is determined to have an optical thickness of λ/4 by including ½ of the adjacent composition gradient layers when the oscillation wavelength is λ.

The following relationship exists between the optical thickness and the actual thickness. When the optical thickness is λ/4, the actual thickness "h"=λ/4N (N is the refractive index of a medium of the layer).

The lower spacer layer 104 is stacked at the +Z side of the lower semiconductor DBR 103 and is formed of non-doped $(Al_{0.1}Ga_{0.9})_{0.5}In_{0.5}P$.

The active layer 105 is stacked at the +Z side of the lower spacer layer 104 and has a triple quantum well structure having quantum well layers of three layers and barrier layers of four layers. Each of the quantum well layers is formed of GaInAsP whose composition induces a compression strain of 0.7%, and has a band gap wavelength of approximately 780 nm. Each of the barrier layers is formed of GaInP whose composition induces a tensile strain of 0.6%.

The upper spacer layer 106 is stacked at the +Z side of the active layer 105 and is formed of non-doped $(Al_{0.1}Ga_{0.9})_{0.5}In_{0.5}P$.

A part formed of the lower spacer layer 104, the active layer 105, and the upper spacer layer 106 is called a resonator structural body, and the thickness of the resonator structural body is determined to be the optical thickness of one wavelength. In order to obtain high stimulated emission probability, the active layer 105 is at a center of the resonator structural body which center corresponds to an anti-node position of a standing wave distribution of an electric field.

The upper semiconductor DBR 107 includes a first upper semiconductor DBR $107_1$ (not shown) and a second upper semiconductor DBR $107_2$ (not shown).

The first upper semiconductor DBR $107_1$ is stacked at the +Z side of the upper spacer layer 106 and includes a pair of a low refractive index layer formed of p-$(Al_{0.7}Ga_{0.3})_{0.5}In_{0.5}P$ and a high refractive index layer formed of p-$(Al_{0.1}Ga_{0.9})_{0.5}In_{0.5}P$. In order to decrease an electric resistance value, a composition gradient layer is formed between the low refractive index layer and the high refractive index layer in which the composition is gradually changed from one composition to the other composition. Each of the low and high refractive index layers is determined to have an optical thickness of λ/4 by including ½ of the adjacent composition gradient layers when the oscillation wavelength is λ.

The second upper semiconductor DBR $107_2$ is stacked at the +Z side of the first upper semiconductor DBR $107_1$ and includes 23 pairs of a low refractive index layer formed of p-$Al_{0.9}Ga_{0.1}As$ and a high refractive index layer formed of p-$Al_{0.3}Ga_{0.7}As$. In order to decrease an electric resistance value, a composition gradient layer is formed between the refractive index layers in which the composition is gradually changed from one composition to the other composition. Each of the low and high refractive index layers is determined to have an optical thickness of λ/4 by including ½ of the adjacent composition gradient layers when the oscillation wavelength is λ.

A layer to be selectively oxidized 108 of 30 nm thickness formed of p-AlAs is inserted into one of the low refractive index layers of the second upper semiconductor DBR $107_2$. The inserting position of the layer to be selectively oxidized 108 is in a $3^{rd}$ pair of the low refractive index layers from the upper spacer layer 106 and at a position corresponding to a node of a standing wave distribution of an electric field.

The contact layer 109 is stacked at the +Z side of the second upper semiconductor DBR $107_2$ and is formed of p-GaAs.

In the following, in some cases, a structure in which plural semiconductor layers are stacked on the substrate 101 is called a layer stacked body.

Next, a manufacturing method of the surface emitting laser element 100 is simply described.

(1): A layer stacked body is formed by crystal growth with the use of an MOCVD (metal organic chemical vapor deposition) method, or an MBE (molecular beam epitaxy) method.

In the above, as a group III raw material, TMA (trimethyl aluminum), TMG (trimethyl gallium), or TMI (trimethyl indium) is used, and as a group V raw material, phosphine ($PH_3$) or arsine ($AsH_3$) is used. In addition, as a raw material of p-type dopant, carbon tetrabromide ($CBr_4$) or dimethylzinc (DMZn) is used, and as a raw material of n-type dopant, hydrogen selenide ($H_2Se$) is used.

Figure 5:
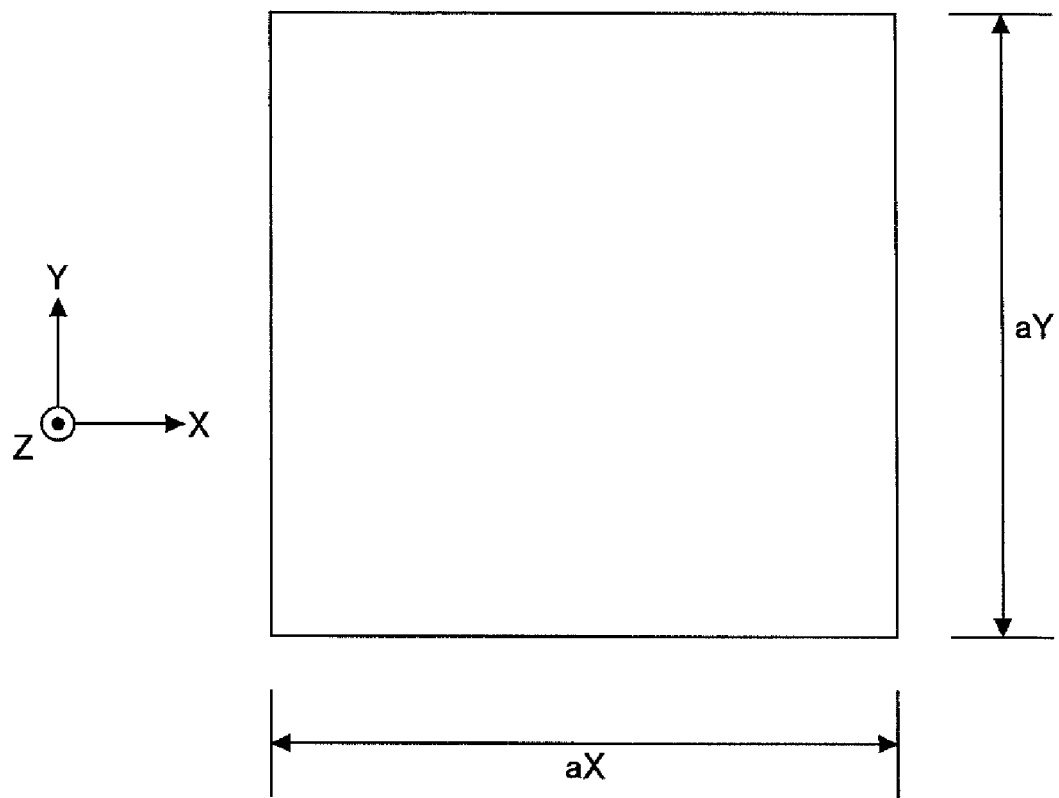
FIG. 5 is a diagram showing a mesa rectangular ratio of the surface emitting laser element shown in FIG. 3.

(2): A resist pattern having a rectangular shape whose length "aX" in the X axis direction is 25.1 μm and whose length "aY" in the Y axis direction is 24.9 μm is formed on a surface of the layer stacked body (see FIG. 5). In the following, in some cases, a value aY/aX is called a mesa rectangular ratio. FIG. 5 is a diagram showing the mesa rectangular ratio of the surface emitting laser element 100.

(3): A mesa having a quadrangular prism shape is formed by using an ECR (electron cyclotron resonance) etching method with the use of a $Cl_2$ gas while using the above resist pattern as a photo-mask. In this, the bottom surface of the etching is positioned in the lower spacer layer 104.

(4): The photo-mask is removed.

(5): Heat treatment is applied to the layer stacked body in water vapor. With this, aluminum (Al) in the layer to be selectively oxidized 108 is selectively oxidized from an outer part of the mesa, and a non-oxidized region 108b surrounded by an oxidized layer 108a of Al remains at the center part of the mesa (see FIG. 3). That is, a so-called oxide confinement structure is formed in which a driving current route of a light emitting part of the surface emitting laser element 100 is confined to the center part of the mesa. The non-oxidized region 108b is a current passing through region (current injection region).

(6): A protection layer 111 of SiN or $SiO_2$ is formed by using a CVD (chemical vapor deposition) method.

(7): The layer stacked body is flattened by a polyimide layer 112.

(8): A window for a p-electrode contact is opened at the upper part of the mesa. In this, a mask of photoresist is formed, an opening part of the photoresist is removed by exposing the opening part at the upper part of the mesa, and the window is opened by etching the polyimide layer 112 and the protection layer 111 with the use of BHF (buffered hydrofluoric acid).

(9): A resist pattern of a square shape of 10 μm sides is formed at a region which becomes a light emitting part at the upper part of the mesa, and a p-electrode material is deposited by vapor deposition. As the p-electrode material, a multilayered film formed of Cr/AuZn/Au or Ti/Pt/Au is used.

(10): A p-electrode 113 is formed by lifting off the electrode material at the light emitting part.

(11): The bottom surface of the substrate 101 is polished so that the thickness of the substrate 101 becomes, for example, 100 μm, and an n-electrode 114 is formed on the bottom surface of the substrate 101. The n-electrode 114 is formed of a multilayered film of AuGe/Ni/Au.

(12): Ohmic contact between the p-electrode 113 and the n-electrode 114 is obtained by annealing. With this the mesa becomes the light emitting part.

(13): The surface emitting laser element 100 is formed as a chip by being cut off.

In the surface emitting laser element 100 manufactured by the above method, the polarization direction of the output laser beam is the X axis direction which is a desirable direction, and the polarization suppression ratio is 20 dB or more and stable. The polarization suppression ratio is a ratio of light intensity in the desirable polarization direction to light intensity in the direction orthogonal to the desirable polarization direction, and it is said that an image forming apparatus such as a copying apparatus is required to have approximately 20 dB. In addition, in the surface emitting laser element 100, a difference between the radiation angles of the output laser beams in the X axis direction and the Y axis direction is 0.1° or less, and the cross sectional shape of the output laser beam is substantially circular.

Figure 6:
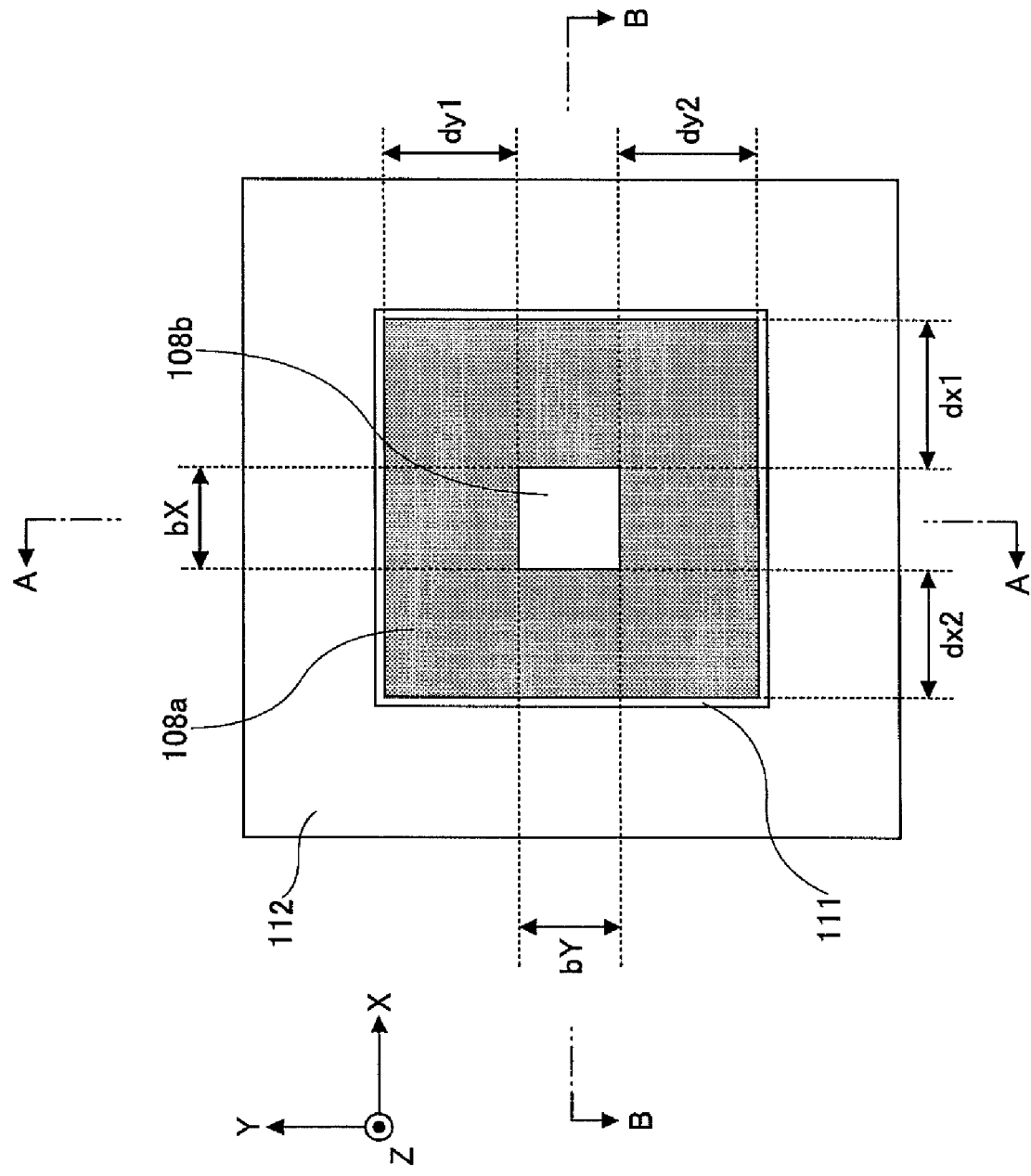
FIG. 6 is a cut-away side view of the surface emitting laser element along line A-A of FIG. 3.

FIG. 6 is a cut-away side view of the surface emitting laser element 100 along line A-A of FIG. 3. That is, an oxide confinement structure of the surface emitting laser element 100 is shown in FIG. 6. In FIG. 6, the followings are defined. That is, a distance from the +Y side end of the oxidized layer 108a to the +Y side end of the current passing through region 108b (the non-oxidized layer) is "dy1", a distance from the −Y side end of the oxidized layer 108a to the −Y side end of the current passing through region 108b is "dy2", a distance from the +X side end of the oxidized layer 108a to the +X side end of the current passing through region 108b is "dx1", and a distance from the −X side end of the oxidized layer 108a to the −X side end of the current passing through region 108b is "dx2". When the distances are measured by using an IR (infrared) microscope, the measured results are dy2>dy1, and dx2≈dx1>dy1. This shows that the oxidation rate in the −Y direction is smaller than the oxidation rates in the +Y, +X, and −X directions.

In addition, in FIG. 6, the followings are defined. That is, a length of the current passing through region 108b in the Y axis direction is "bY", and a length of the current passing through region 108b in the X axis direction is "bX". Then the lengths are measured and the measured results are "bY"=4.1 μm, "bX"=3.9 μm, and "bY/bX" (the rectangular ratio of the current passing through region 108b) is 1.05.

FIG. 7 is a cut-away side view of the oxide confinement structure shown in FIG. 6 along line A-A of FIG. 6. In FIG. 7, the followings are defined. That is, the thickness of the oxidized layer 108a at the +Y side of the current passing through region 108b is "Sy1", and the thickness of the oxidized layer 108a at the −Y side of the current passing through region 108b is "Sy2". Then when the thicknesses are measured at several positions in the Y axis direction, "Sy1" is greater than "Sy2" by approximately 2 nm even if the distances from the oxidation end parts are the same, for example, at the distances of "d" in FIG. 7. That is, the inventors have found that the thickness of the oxidized layer 108a is relatively great in the region where the oxidation rate is small.

FIG. 8 is a cut-away side view of the oxide confinement structure shown in FIG. 6 along line B-B of FIG. 6. In FIG. 8, the followings are defined. That is, the thickness of the oxidized layer 108a at the −X side of the current passing through region 108b is "Sx1", and the thickness of the oxidized layer 108a at the +X side of the current passing through region 108b is "Sx2". Then when the thicknesses are measured at several positions in the X axis direction, "Sx1" is substantially equal to "Sx2" when the distances from the oxidation end parts are the same, for example, at the distances of "d" in FIG. 8. In addition, the thicknesses of "Sx1" and "Sx2" are smaller than the thickness of "Sy1" even if the distance from the oxidation end part is the same.

Generally, in a surface emitting laser element, the radiation angle of the output laser beam tends to be great when light confinement in the lateral direction (hereinafter, in some cases, simply referred to as light confinement) is great. In addition, the degree of the light confinement becomes great when the width of the current passing through region is small and the thickness of the oxidized layer is great.

In the surface emitting laser element 100, the thicknesses "dx1" and "dx2" of the oxidized layer 108a which causes the width of the current passing through region 108b to be small are small, and the thickness "dy2" of the oxidized layer 108a which causes the width of the current passing through region 108b to be large is great. With this, even if the current passing through region 108b does not have a square shape, the cross sectional shape of the output laser beam can be substantially a circle.

That is, in the direction where the light confinement by the thickness of the oxidized layer 108a is small (in the X axis direction), the width of the non-oxidized layer 108b (the current passing through region) is caused to be small, the degree of the light confinement is caused to be great, and the radiation angles of the output laser beams can be isotropic.

Figure 9:
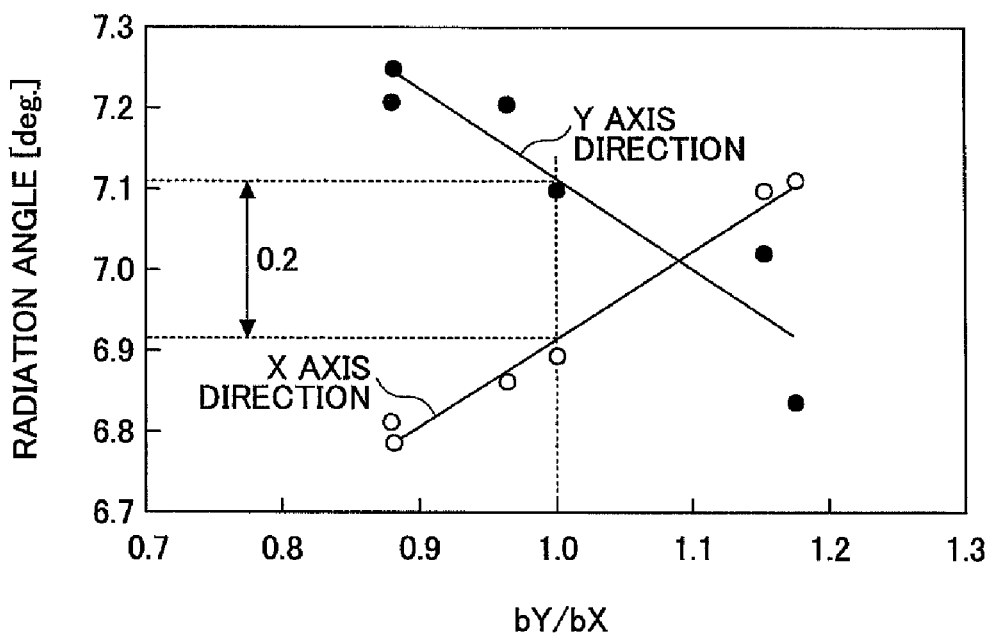
FIG. 9 is a graph showing a relationship between a rectangular ratio of a current passing through region and a radiation angle of an output laser beam of a surface emitting laser element using an inclined substrate similar to the substrate shown in FIG. 3.

FIG. 9 is a graph showing a relationship between the rectangular ratio of the current passing through region and the radiation angle of the output laser beam of a surface emitting laser element using an inclined substrate similar to the substrate 101. When the current passing through region has a square shape (bY/bX=1.0), the difference of the radiation angles (hereinafter, in some cases, simply referred to as a radiation angle difference) between in the X and Y axes directions is 0.2°, and the cross sectional shape of the output laser beam is ellipsoidal.

However, in the surface emitting laser element 100 of the present embodiment, the width (in the Y direction) of the current passing through region 108b surrounded by the oxidized layer 108a whose thickness is great is wider than the width (in the X direction) of the current passing through region 108b surrounded by the oxidized layer 108a whose thickness is small. Therefore, the radiation angle difference can be smaller than that of the surface emitting laser element shown in FIG. 9.

Figure 10:
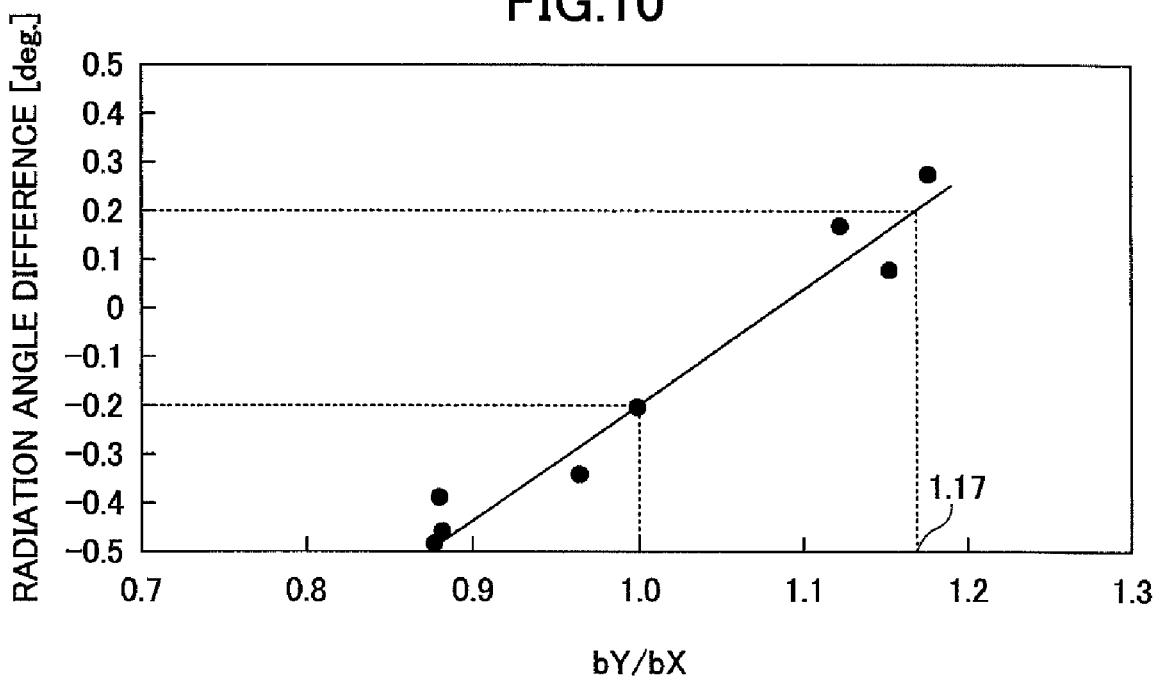
FIG. 10 is a graph showing a relationship between the rectangular ratio of the current passing through region and a radiation angle difference of a surface emitting laser element using an inclined substrate similar to the substrate shown in FIG. 3.

FIG. 10 is a graph showing a relationship between the rectangular ratio of the current passing through region and the radiation angle difference of a surface emitting laser element using an inclined substrate similar to the substrate 101. As shown in FIG. 10, there is a linear correlation between the rectangular ratio of the current passing through region and the radiation angle difference. When the rectangular ratio of the current passing through region is more than 1.0 and less than 1.17, the radiation angle difference can be smaller than a case where the current passing through region has a square shape.

Figure 11:
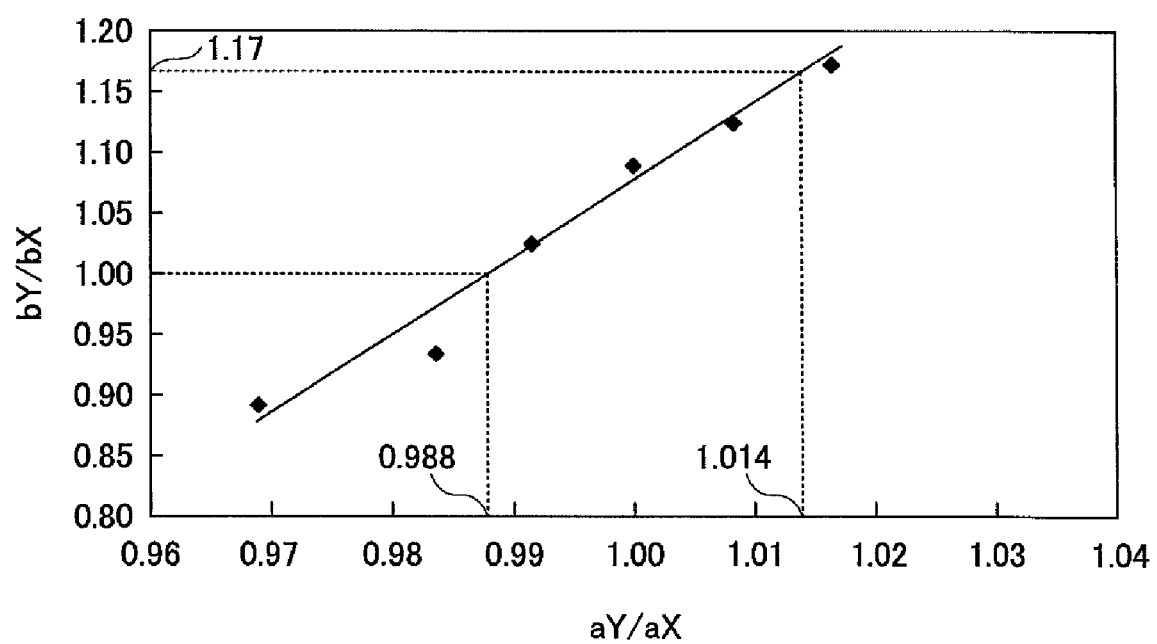
FIG. 11 is a graph showing a relationship between the rectangular ratio of the current passing through region and a mesa rectangular ratio of a surface emitting laser element using an inclined substrate similar to the substrate shown in FIG. 3.

FIG. 11 is a graph showing a relationship between the rectangular ratio of the current passing through region (bY/bX) and the mesa rectangular ratio (aY/aX) (see FIG. 5) of a surface emitting laser element using an inclined substrate similar to the substrate 101. As shown in FIG. 11, there is a linear correlation between the rectangular ratio of the current passing through region and the mesa rectangular ratio. When the mesa rectangular ratio is more than 0.988 and less than 1.014, the rectangular ratio of the current passing through region can be more than 1.0 and less than 1.17. In the surface emitting laser element 100 of the present invention, the mesa rectangular ratio (aY/aX) is 0.992.

As described above, according to the surface emitting laser element 100 in the present embodiment, on the substrate 101 in which the normal direction of the principal surface (the mirror polished surface) is inclined by 15 degrees in the [1 1 1] crystal orientation A direction relative to the [1 0 0] crystal orientation direction, the resonator structural body including the active layer 105 and the plural semiconductor layers including the lower semiconductor DBR 103 and the upper semiconductor DBR 107 sandwiching the resonator structural body are stacked.

In addition, the shape of the current passing region 108b of the oxide confinement structure in the upper semiconductor DBR 107 is symmetrical for an axis (first axis) which passes through the center of the current passing through region 108b and is parallel to the X axis and is symmetrical for another axis (second axis) which passes through the center of the current passing through region 108b and is parallel to the Y axis. Further, the length of the current passing through region 108b in the Y axis direction is greater than the length of the current passing through region 108b in the X axis direction.

In addition, in the oxidized layer 108a surrounding the current passing through region 108b, the oxidized thickness is greater in the −Y direction than the oxidized thickness in the +X and −X directions.

Therefore, according to the surface emitting laser element 100 of the present embodiment, the stability of the output laser beam in the polarization direction can be increased without causing high cost, and the cross sectional shape of the output laser beam can be approximately ellipsoidal.

In addition, according to the optical scanning device 1010 of the present embodiment, since the light source 14 includes the surface emitting laser element 100, high accurate optical scanning can be performed without causing high cost.

In addition, according to the laser printer 1000 of the present embodiment, since the laser printer 1000 includes the optical scanning device 1010, a high quality image can be formed without causing high cost.

Figure 12:
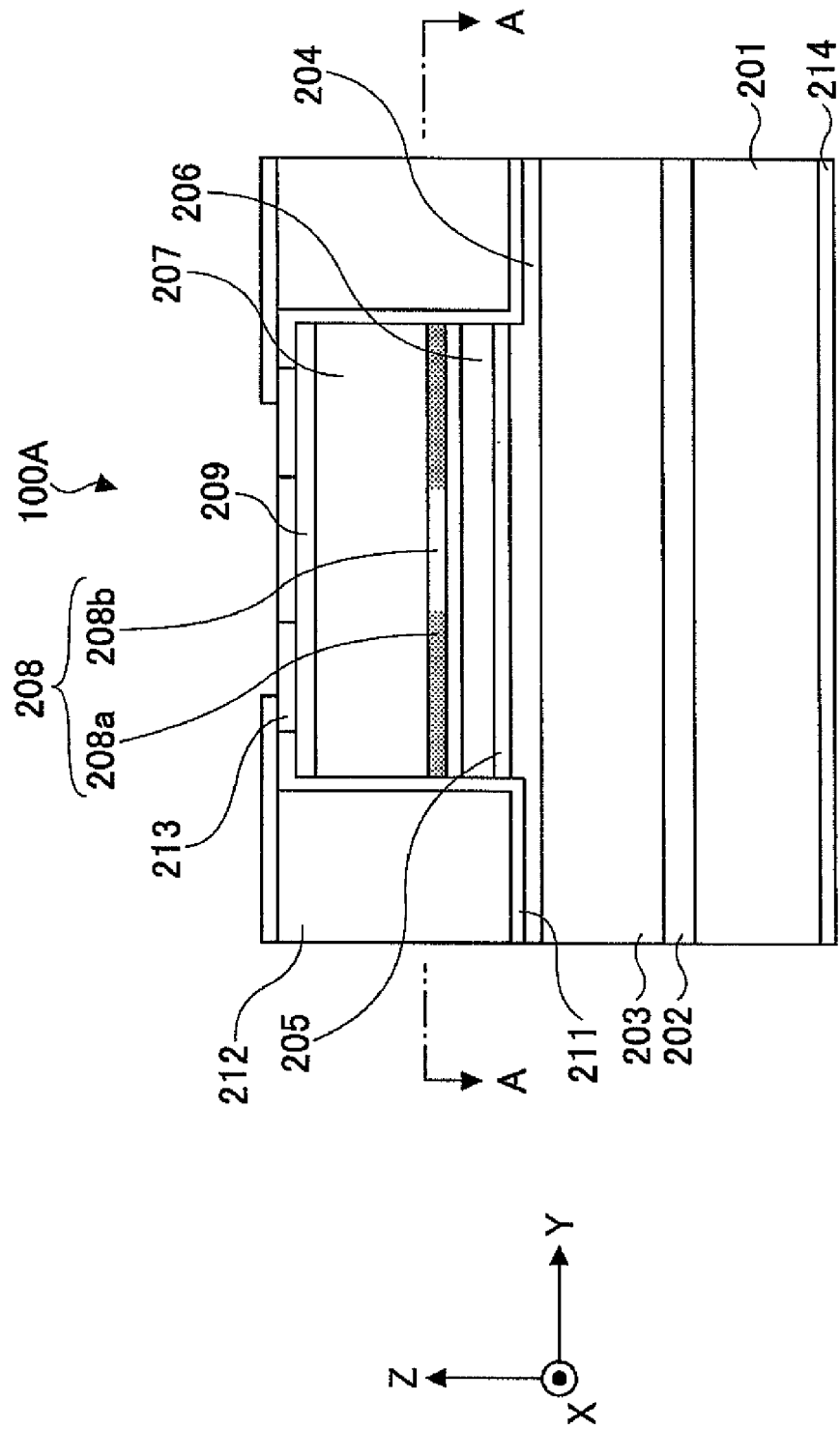
FIG. 12 is a cut-away side view of another surface emitting laser element according to the embodiment of the present invention.

In the embodiment of the present invention described above, the light source 14 of the optical scanning device 1010 can include a surface emitting laser element 100A shown in FIG. 12 instead of including the surface emitting laser element 100 shown FIG. 3.

FIG. 12 is a cut-away side view of the surface emitting laser element 100A according to the embodiment of the present invention.

A designed oscillation wavelength of the surface emitting laser element 100A is in a 780 nm band. The surface emitting laser element 100A includes a substrate 201, a buffer layer 202, a lower semiconductor DBR 203, a lower spacer layer 204, an active layer 205, an upper spacer layer 206, an upper semiconductor DBR 207, a contact layer 209, and so on.

Similar to the substrate 101, the substrate 201 is an inclined substrate.

The buffer layer 202 is stacked on a +Z side surface of the substrate 201 and is formed of n-GaAs.

The lower semiconductor DBR 203 is stacked at the +Z side of the buffer layer 202 and includes 40.5 pairs of a low refractive index layer formed of n-$Al_{0.9}Ga_{0.1}As$ and a high refractive index layer formed of n-$Al_{0.3}Ga_{0.7}As$.

In addition, in order to decrease an electric resistance value, a composition gradient layer of 20 nm thickness is formed between the refractive index layers in which the composition is gradually changed from one composition to the other composition. Each of the refractive index layers is determined to have an optical thickness of $\lambda/4$ by including ½ of the adjacent composition gradient layers when the oscillation wavelength is $\lambda$.

The lower spacer layer 204 is stacked at the +Z side of the lower semiconductor DBR 203 and is formed of non-doped $(Al_{0.1}Ga_{0.9})_{0.5}In_{0.5}P$.

The active layer 205 is stacked at the +Z side of the lower spacer layer 204 and has a triple quantum well structure having quantum well layers of three layers and barrier layers of four layers. Each of the quantum well layers is formed of GaInAsP whose composition induces a compression strain of 1.1%, and each of the barrier layers is formed of GaInP whose tensile strain is 0.0%.

The upper spacer layer 206 is stacked at the +Z side of the active layer 205 and is formed of non-doped $(Al_{0.1}Ga_{0.9})_{0.5}In_{0.5}P$.

A part formed of the lower spacer layer 204, the active layer 205, and the upper spacer layer 206 is called a resonator structural body, and the thickness of the resonator structural body is determined to be the optical thickness of one wavelength. In order to obtain high stimulated emission probability, the active layer 205 is at a center of the resonator structural body which center corresponds to an anti-node position of a standing wave distribution of an electric field.

The upper semiconductor DBR 207 includes a first upper semiconductor DBR $207_1$ (not shown) and a second upper semiconductor DBR $207_2$ (not shown).

The first upper semiconductor DBR $207_1$ is stacked at the +Z side of the upper spacer layer 206 and includes a pair of a low refractive index layer formed of p-$(Al_{0.7}Ga_{0.3})_{0.5}In_{0.5}P$ and a high refractive index layer formed of p-$(Al_{0.1}Ga_{0.9})_{0.5}In_{0.5}P$. In order to decrease an electric resistance value, a composition gradient layer is formed between the low refractive index layer and the high refractive index layer in which the composition is gradually changed from one composition to the other composition. Each of the low and high refractive index layers is determined to have an optical thickness of $\lambda/4$ by including ½ of the adjacent composition gradient layers when the oscillation wavelength is $\lambda$.

The second upper semiconductor DBR $207_2$ is stacked at the +Z side of the first upper semiconductor DBR $207_1$ and includes 23 pairs of a low refractive index layer formed of p-$Al_{0.9}Ga_{0.1}As$ and a high refractive index layer formed of p-$Al_{0.3}Ga_{0.7}As$. In order to decrease an electric resistance value, a composition gradient layer is formed between the refractive index layers in which the composition is gradually changed from one composition to the other composition. Each of the low and high refractive index layers is determined to have an optical thickness of $\lambda/4$ by including ½ of the adjacent composition gradient layers when the oscillation wavelength is $\lambda$.

A layer to be selectively oxidized 208 of 30 nm thickness formed of p-AlAs is inserted into one of the low refractive index layers of the second upper semiconductor DBR $207_2$.

The inserting position of the layer to be selectively oxidized 208 is in a 3$^{rd}$ pair of the low refractive index layers from the upper spacer layer 206 and at a position corresponding to a node of a standing wave distribution of an electric field.

The contact layer 209 is stacked at the +Z side of the second upper semiconductor DBR 207$_2$ and is formed of p-GaAs.

The surface emitting laser element 100A further includes a protection layer 211, a polyimide layer 212, a p-electrode 213, and an n-electrode 214. However, each of the functions of the protection layer 211, the polyimide layer 212, the p-electrode 213, and the n-electrode 214 is similar to each of the functions of the protection layer 111, the polyimide layer 112, the p-electrode 113, and the n-electrode 114 of the surface emitting laser element 100, respectively. Therefore, the descriptions of the above elements are omitted.

The surface emitting laser element 100A can be manufactured by a manufacturing method similar to the manufacturing method of the surface emitting laser element 100.

In the surface emitting laser element 100A, the polarization direction of the output laser beam is the Y axis direction which is a desirable direction, and the polarization suppression ratio is 20 dB or more and stable. In addition, in the surface emitting laser element 100A, a difference between the radiation angles of the output laser beams in the X axis direction and the Y axis direction is 0.1° or less, and the cross sectional shape of the output laser beam is substantially circular.

Figure 13:
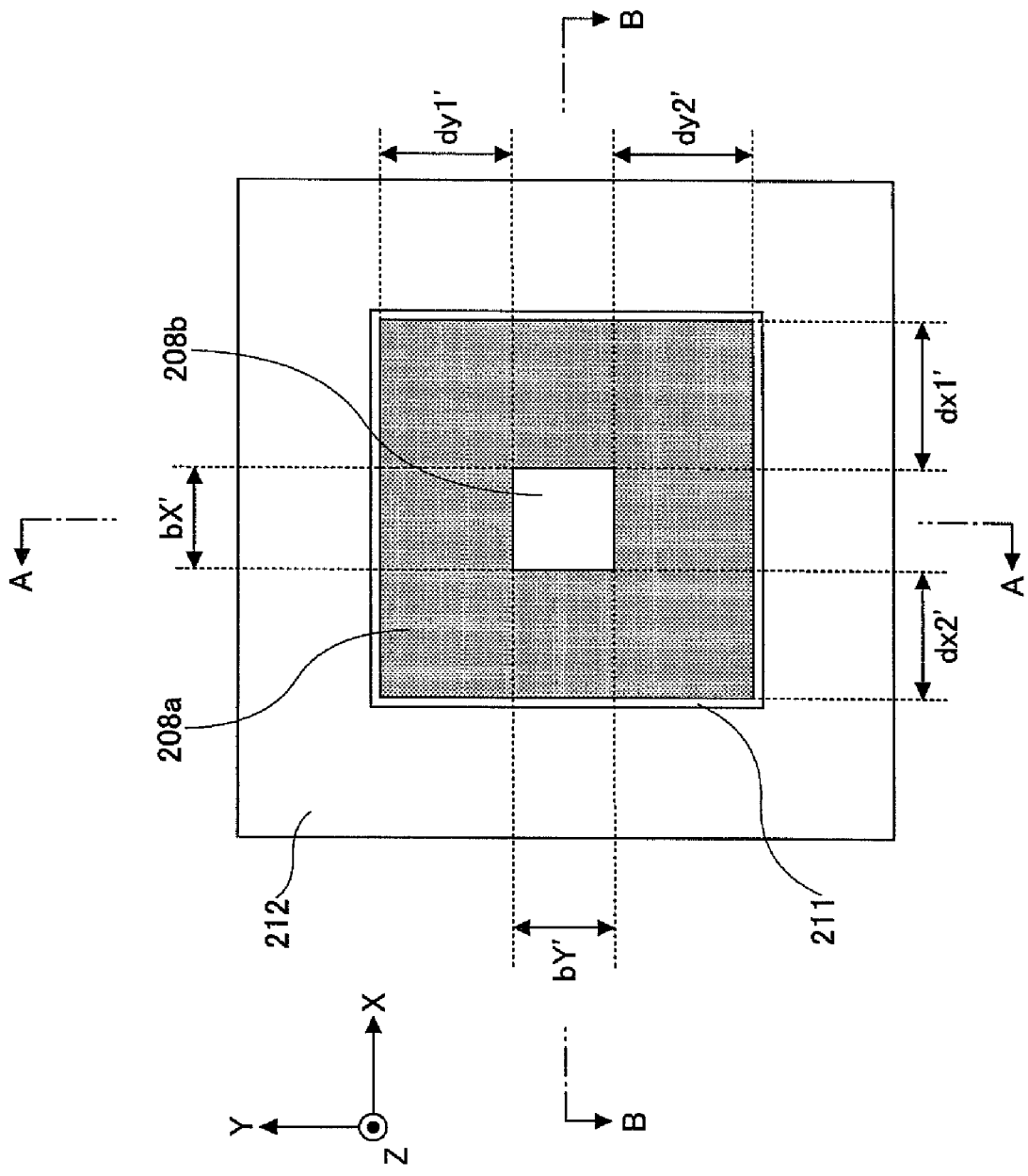
FIG. 13 is a cut-away side view of the surface emitting laser element along line A-A of FIG. 12.

FIG. 13 is a cut-away side view of the surface emitting laser element 100A along line A-A of FIG. 12. That is, an oxide confinement structure of the surface emitting laser element 100A is shown in FIG. 13. In FIG. 13, the followings are defined. That is, a distance from the +Y side end of an oxidized layer 208a to the +Y side end of a current passing through region 208b (a non-oxidized layer) is "dy1'", a distance from the −Y side end of the oxidized layer 208a to the −Y side end of the current passing through region 208b is "dy2'", a distance from the +X side end of the oxidized layer 208a to the +X side end of the current passing through region 208b is "dx1'", and a distance from the −X side end of the oxidized layer 208a to the −X side end of the current passing through region 208b is "dx2'". When the distances are measured by using an IR microscope, the measured results are dy2'>dy1', and dx2'≈dx1'>dy1'. This shows that the oxidization rate in the −Y direction is smaller than the oxidization rates in the +Y, +X, and −X directions.

In addition, in FIG. 13, the followings are defined. That is, a length of the current passing through region 208b in the Y axis direction is "bY'", and a length of the current passing through region 208b in the X axis direction is "bX'". Then the lengths are measured and the measured results are "bY'"=4.1 μm, "bX'"=3.9 μm, and "bY'/bX'" (the rectangular ratio of the current passing through region 208b) is 1.05.

FIG. 14 is a cut-away side view of the oxide confinement structure shown in FIG. 13 along line A-A of FIG. 13. In FIG. 14, the followings are defined. That is, the thickness of the oxidized layer 208a at the +Y side of the current passing through region 208b is "Sy1'", and the thickness of the oxidized layer 208a at the −Y side of the current passing through region 208b is "Sy2'". Then when the thicknesses are measured at several positions in the Y axis direction, "Sy1'" is greater than "Sy2'" by approximately 2 nm even if the distances from the oxidation end parts are the same, for example, at the distances of "d" in FIG. 14.

FIG. 15 is a cut-away side view of the oxide confinement structure shown in FIG. 13 along line B-B of FIG. 13. In FIG. 15, the followings are defined. That is, the thickness of the oxidized layer 208a at the −X side of the current passing through region 208b is "Sx1'", and the thickness of the oxidized layer 208a at the +X side of the current passing through region 208b is "Sx2'". Then when the thicknesses are measured at several positions in the X axis direction, "Sx1'" is substantially equal to "Sx2'" when the distances from the oxidation end parts are the same, for example, at the distances of "d" in FIG. 15. In addition, the thicknesses of "Sx1'" and "Sx2'" are smaller than the thickness of "Sy1'" even if the distance from the oxidation end part is the same.

Figure 16:
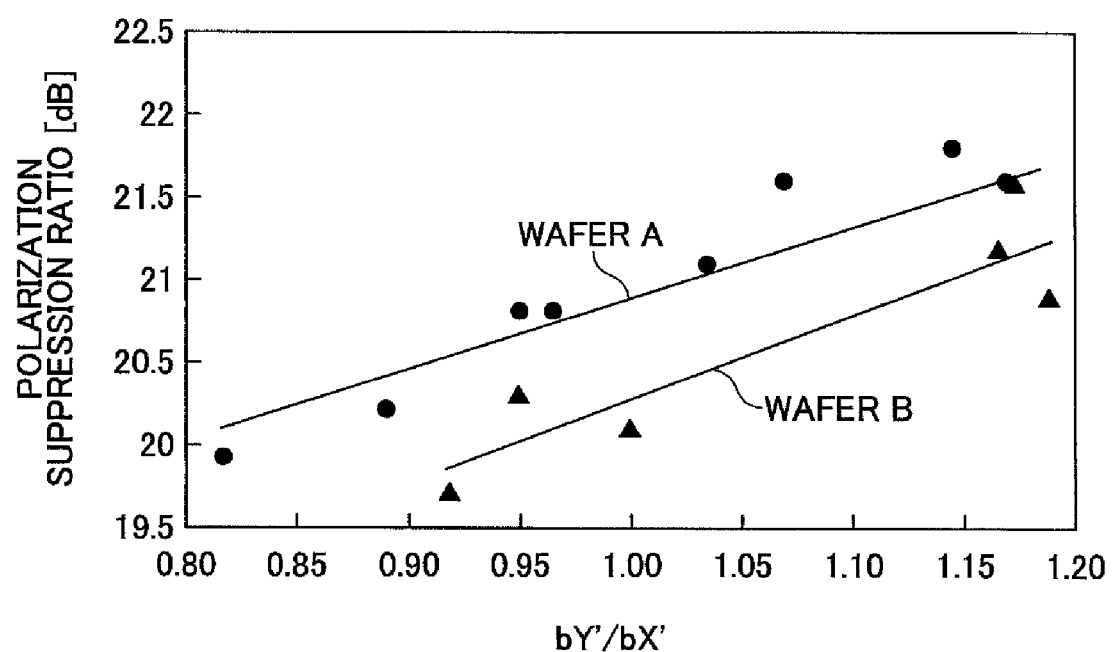
FIG. 16 is a graph showing a relationship between the rectangular ratio of the current passing through region and a polarization suppression ratio in a surface emitting laser element having a structure similar to the surface emitting laser element shown in FIG. 12.

FIG. 16 is a graph showing a relationship between the rectangular ratio (bY'/bX') of a current passing through region and a polarization suppression ratio in a surface emitting laser element having a structure similar to the surface emitting laser element 100A. In FIG. 16, wafers A and B of the surface emitting laser elements are manufactured and the relationships are measured. As shown in FIG. 16, as the shape of the current passing through region, when the length in the Y axis direction is greater than the length in the X axis direction (bY'/bX'>1), the polarization suppression ratio can be great.

Figure 17:
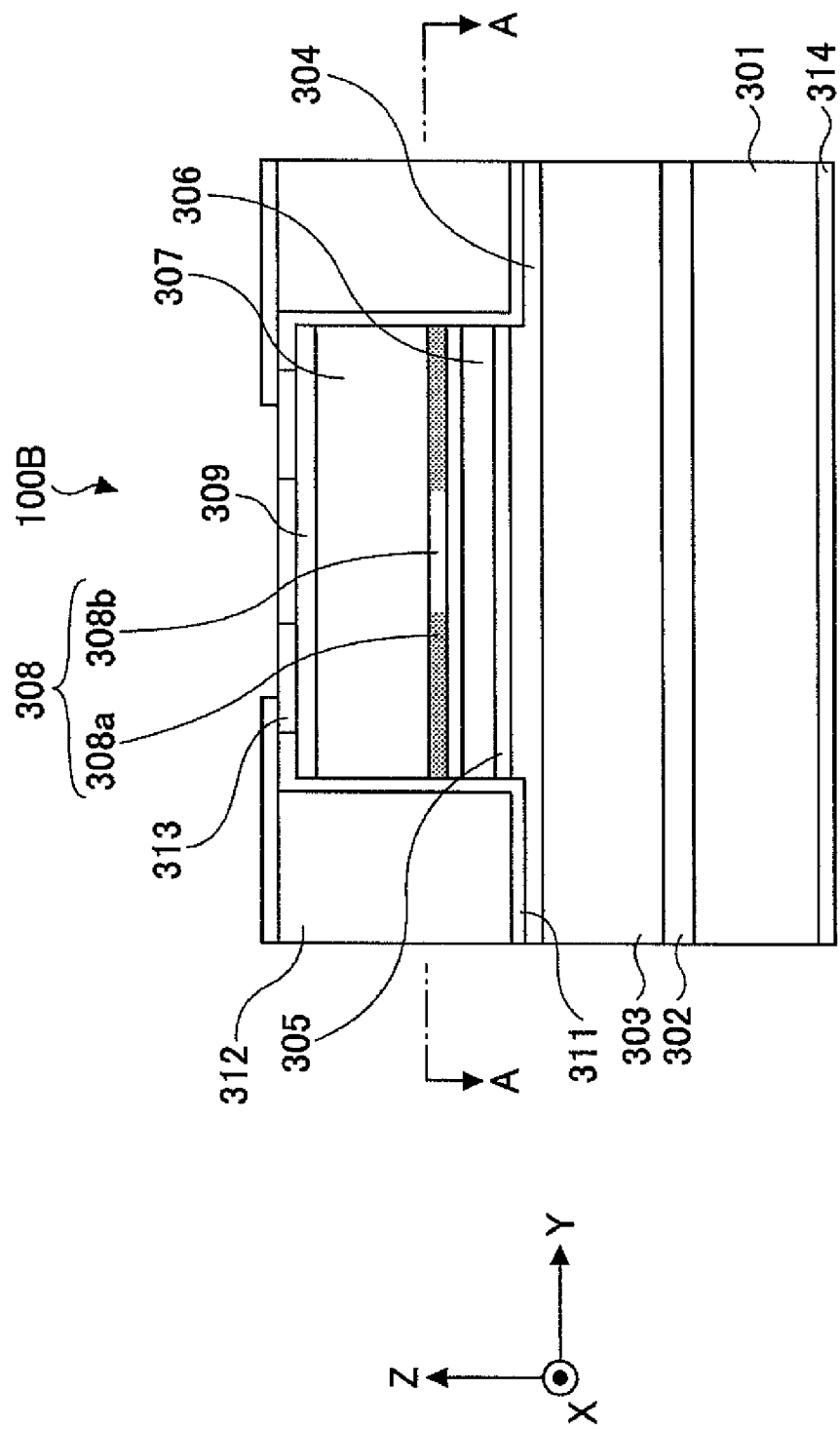
FIG. 17 is a cut-away side view of another surface emitting laser element according to the embodiment of the present invention.

In the embodiment of the present invention described above, the light source 14 of the optical scanning device 1010 can include a surface emitting laser element 100B shown in FIG. 17 instead of including the surface emitting laser element 100 shown FIG. 3.

FIG. 17 is a cut-away side view of the surface emitting laser element 100B according to the embodiment of the present invention.

In the surface emitting laser element 100B, the thickness of a layer to be selectively oxidized 308 is greater than the thickness of the layer to be selectively oxidized 108 in the surface emitting laser element 100.

A designed oscillation wavelength of the surface emitting laser element 100B is in a 780 nm band. The surface emitting laser element 100B includes a substrate 301, a buffer layer 302, a lower semiconductor DBR 303, a lower spacer layer 304, an active layer 305, an upper spacer layer 306, an upper semiconductor DBR 307, a contact layer 309, and so on.

Similar to the substrate 101, the substrate 301 is an inclined substrate.

The buffer layer 302 is stacked on a +Z side surface of the substrate 301 and is formed of n-GaAs.

The lower semiconductor DBR 303 is stacked at the +Z side of the buffer layer 302 and includes 40.5 pairs of a low refractive index layer formed of n-AlAs and a high refractive index layer formed of n-$Al_{0.3}Ga_{0.7}As$.

In addition, in order to decrease an electric resistance value, a composition gradient layer of 20 nm thickness is formed between the refractive index layers in which the composition is gradually changed from one composition to the other composition. Each of the refractive index layers is determined to have an optical thickness of λ/4 by including ½ of the adjacent composition gradient layers when the oscillation wavelength is λ.

The lower spacer layer 304 is stacked at the +Z side of the lower semiconductor DBR 303 and is formed of non-doped $(Al_{0.1}Ga_{0.9})_{0.5}In_{0.5}P$.

The active layer 305 is stacked at the +Z side of the lower spacer layer 304 and has a triple quantum well structure having quantum well layers of three layers and barrier layers of four layers. Each of the quantum well layers is formed of GaInAsP whose composition induces a compression strain of 0.7%, and has a band gap wavelength of approximately 780 nm. In addition, each of the barrier layers is formed of GaInP whose tensile strain is 0.6%.

The upper spacer layer 306 is stacked at the +Z side of the active layer 305 and is formed of non-doped $(Al_{0.1}Ga_{0.9})_{0.5}In_{0.5}P$.

A part formed of the lower spacer layer 304, the active layer 305, and the upper spacer layer 306 is called a resonator structural body, and the thickness of the resonator structural body is determined to be the optical thickness of one wavelength. In order to obtain high stimulated emission probability, the active layer 305 is at a center of the resonator structural body which center corresponds to an anti-node position of a standing wave distribution of an electric field.

The upper semiconductor DBR 307 includes a first upper semiconductor DBR $307_1$ (not shown) and a second upper semiconductor DBR $307_2$ (not shown).

The first upper semiconductor DBR $307_1$ is stacked at the +Z side of the upper spacer layer 306 and includes a pair of a low refractive index layer formed of p-$(Al_{0.7}Ga_{0.3})_{0.5}In_{0.5}P$ and a high refractive index layer formed of p-$(Al_{0.1}Ga_{0.9})_{0.5}In_{0.5}P$. In order to decrease an electric resistance value, a composition gradient layer is formed between the low refractive index layer and the high refractive index layer in which the composition is gradually changed from one composition to the other composition. Each of the low and high refractive index layers is determined to have an optical thickness of $\lambda/4$ by including ½ of the adjacent composition gradient layers when the oscillation wavelength is $\lambda$.

The second upper semiconductor DBR $307_2$ is stacked at the +Z side of the first upper semiconductor DBR $307_1$ and includes 23 pairs of a low refractive index layer formed of p-$Al_{0.9}Ga_{0.1}As$ and a high refractive index layer formed of p-$Al_{0.3}Ga_{0.7}As$. In order to decrease an electric resistance value, a composition gradient layer is formed between the refractive index layers in which the composition is gradually changed from one composition to the other composition. Each of the low and high refractive index layers is determined to have an optical thickness of $\lambda/4$ by including ½ of the adjacent composition gradient layers when the oscillation wavelength is $\lambda$.

The layer to be selectively oxidized 308 of 34 nm thickness formed of p-AlAs is inserted into one of the low refractive index layers of the second upper semiconductor DBR $307_2$. The inserting position of the layer to be selectively oxidized 308 is in a $3^{rd}$ pair of the low refractive index layers from the upper spacer layer 306 and at a position corresponding to a node of a standing wave distribution of an electric field.

The contact layer 309 is stacked at the +Z side of the second upper semiconductor DBR $307_2$ and is formed of p-GaAs.

The surface emitting laser element 100B further includes a protection layer 311, a polyimide layer 312, a p-electrode 313, and an n-electrode 314. However, each of the functions of the protection layer 311, the polyimide layer 312, the p-electrode 313, and the n-electrode 314 is similar to each of the functions of the protection layer 111, the polyimide layer 112, the p-electrode 113, and the n-electrode 114 of the surface emitting laser element 100, respectively. Therefore, the descriptions of the above elements are omitted.

The surface emitting laser element 100B can be manufactured by a manufacturing method similar to the manufacturing method of the surface emitting laser element 100. However, the shape of the resist pattern to be formed on a surface of the layer stacked body is determined to be that the length "aX" in the X axis direction is 25.2 µm and the length "aY" in the Y axis direction is 24.8 µm. That is, the lengths "aX" and "aY" are different from those of the surface emitting laser element 100 (see FIG. 5).

In the surface emitting laser element 100B, the polarization direction of the output laser beam is the X axis direction which is a desirable direction, and the polarization suppression ratio is 20 dB or more and stable. In addition, in the surface emitting laser element 100B, a difference between the radiation angles of the output laser beams in the X axis direction and the Y axis direction is 0.1° or less, and the cross sectional shape of the output laser beam is substantially circular.

Figure 18:
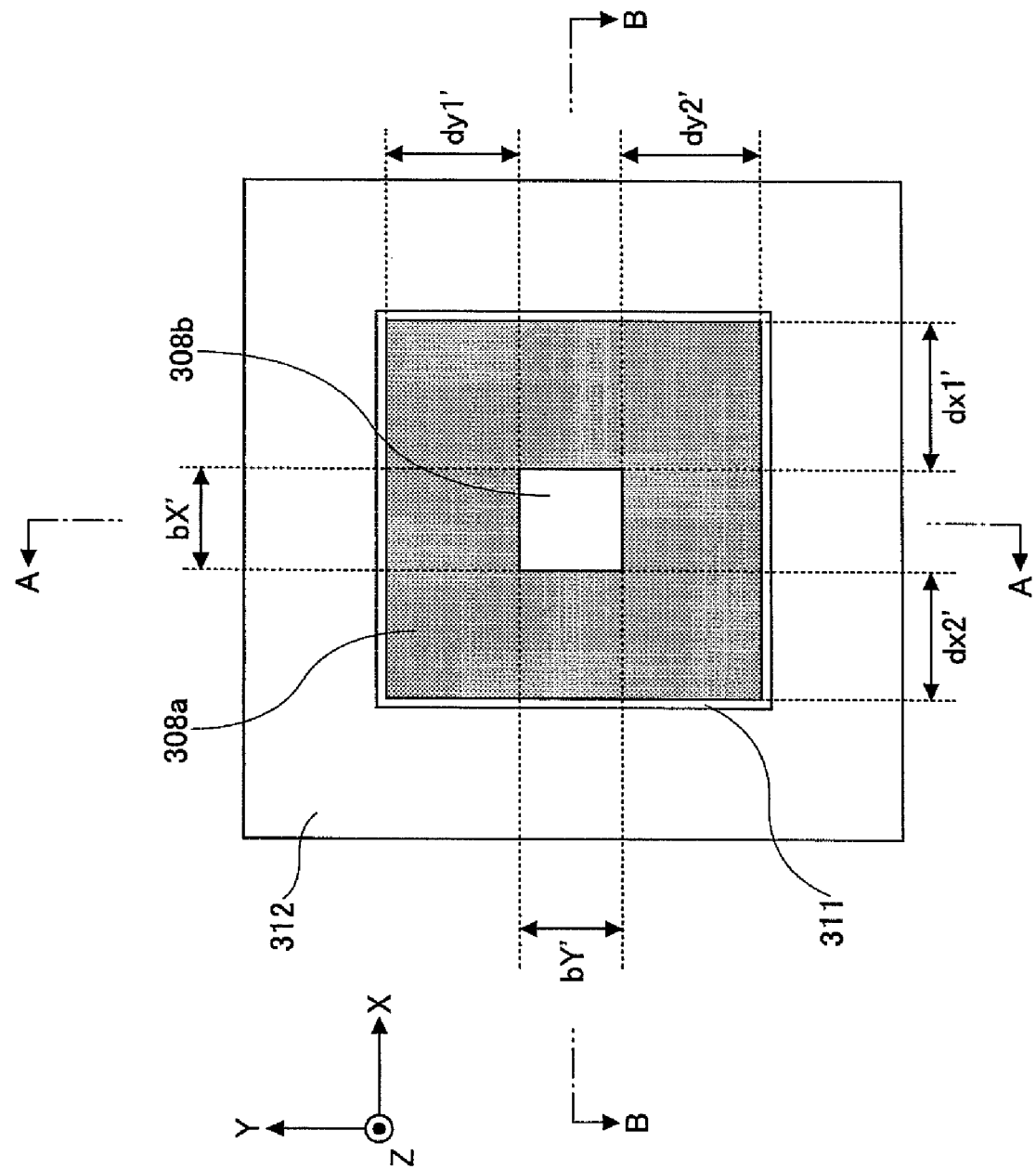
FIG. 18 is a cut-away side view of the surface emitting laser element along line A-A of FIG. 17.

FIG. 18 is a cut-away side view of the surface emitting laser element 100B along line A-A of FIG. 17. That is, an oxide confinement structure of the surface emitting laser element 100B is shown in FIG. 18. In FIG. 18, the followings are defined. That is, a distance from the +Y side end of an oxidized layer 308a to the +Y side end of a current passing through region 308b (a non-oxidized layer) is "dy1'", a distance from the −Y side end of the oxidized layer 308a to the −Y side end of the current passing through region 308b is "dy2'", a distance from the +X side end of the oxidized layer 308a to the +X side end of the current passing through region 308b is "dx1'", and a distance from the −X side end of the oxidized layer 308a to the −X side end of the current passing through region 308b is "dx2'". That is, in FIG. 18, the same distance signs as those shown in FIG. 13 are used. When the distances are measured by using an IR microscope, the measured results are dy2'>dy1', and dy2'>dx2'≈dx1'. This shows that the oxidization rate in the +Y direction is greater than the oxidization rates in the −Y, +X, and −X directions.

In addition, in FIG. 18, the followings are defined. That is, a length of the current passing through region 308b in the Y axis direction is "bY'", and a length of the current passing through region 308b in the X axis direction is "bX'". Then the lengths are measured and "bY'/bX'" (the rectangular ratio of the current passing through region 308b) is 0.95.

Figure 19:
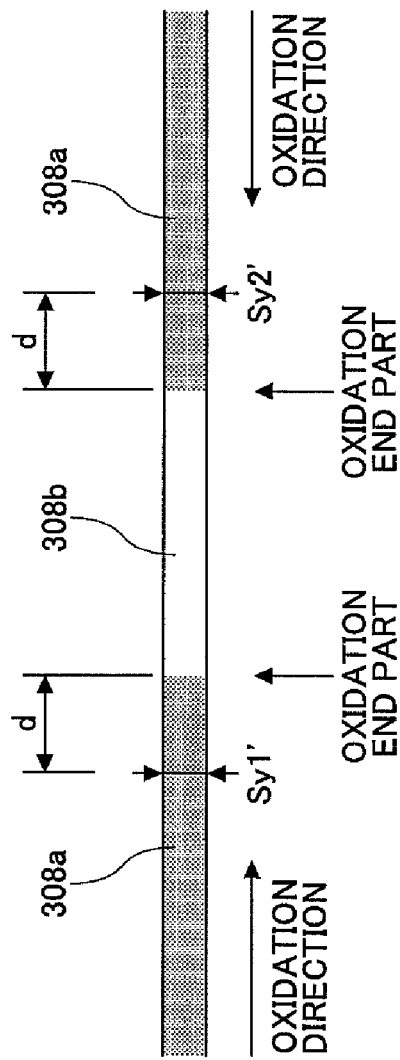
FIG. 19 is a cut-away side view of the oxide confinement structure shown in FIG. 18 along line A-A of FIG. 18.

FIG. 19 is a cut-away side view of the oxide confinement structure shown in FIG. 18 along line A-A of FIG. 18. In FIG. 19, the followings are defined. That is, the thickness of the oxidized layer 308a at the +Y side of the current passing through region 308b is "Sy1'", and the thickness of the oxidized layer 308a at the −Y side of the current passing through region 308b is "Sy2'". Then when the thicknesses are measured at several positions in the Y axis direction, "Sy2'" is smaller than "Sy1'", even if the distances from the oxidation end parts are the same, that is, for example, at the distances of "d" in FIG. 19.

Figure 20:
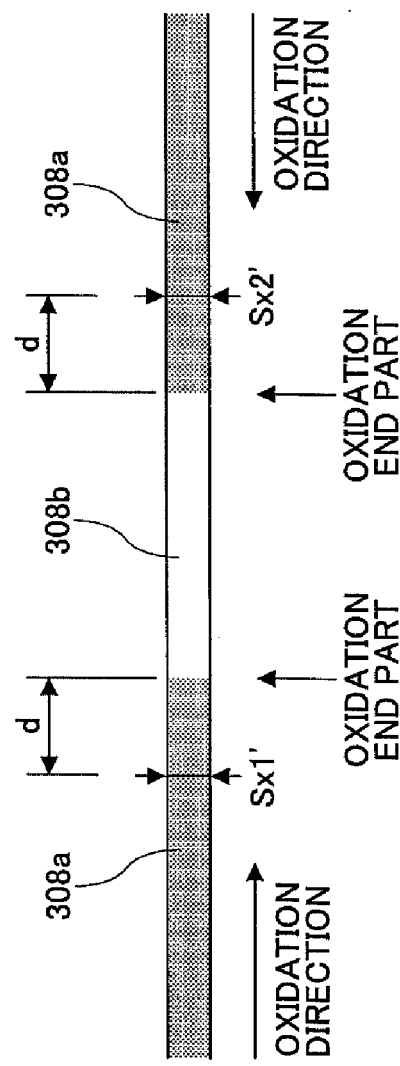
FIG. 20 is a cut-away side view of the oxide confinement structure shown in FIG. 18 along line B-B of FIG. 18.

FIG. 20 is a cut-away side view of the oxide confinement structure shown in FIG. 18 along line B-B of FIG. 18. In FIG. 20, the followings are defined. That is, the thickness of the oxidized layer 308a at the −X side of the current passing through region 308b is "Sx1'", and the thickness of the oxidized layer 308a at the +X side of the current passing through region 208b is "Sx2'". That is, in FIG. 20, the same distance signs as those shown in FIG. 15 are used. Then when the thicknesses are measured at several positions in the X axis direction, "Sx1'" is substantially equal to "Sx2'" when the distances from the oxidation end parts are the same, for example, at the positions of the distances "d" in FIG. 20. In addition, the thicknesses of "Sx1'" and "Sx2'" are greater than the thickness of "Sy2'" even if the distance from the oxidation end part is the same.

Figure 21:
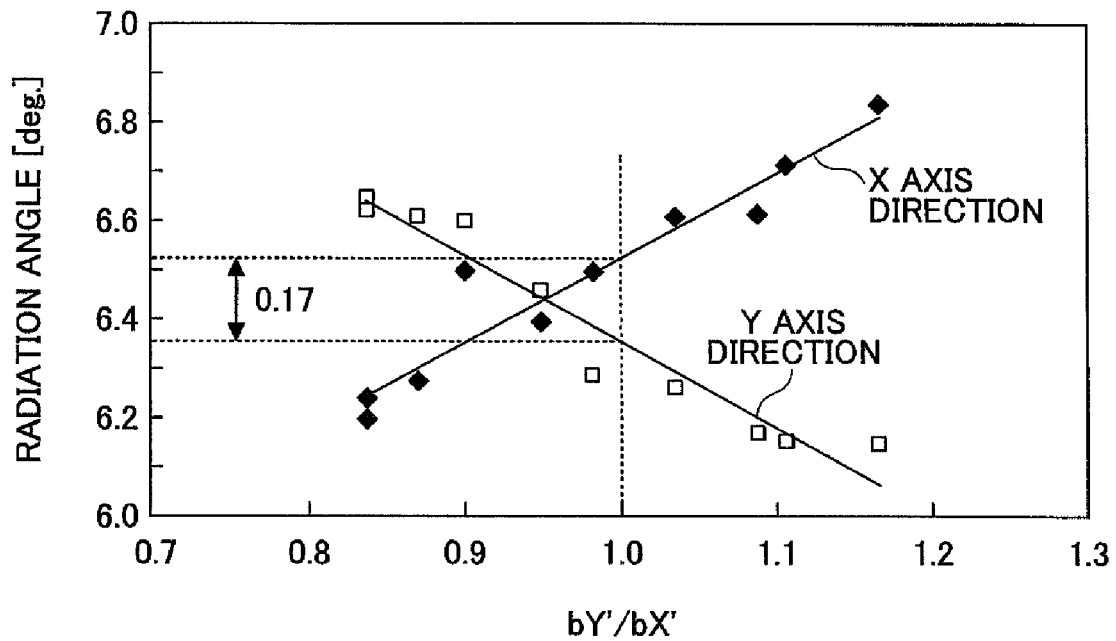
FIG. 21 is a graph showing a relationship between the rectangular ratio of the current passing through region and the radiation angle of the output laser beam of a surface emitting laser element having a structure similar to the structure of the surface emitting laser element shown in FIG. 17.

FIG. 21 is a graph showing a relationship between the rectangular ratio of the current passing through region and the radiation angle of the output laser beam of a surface emitting laser element having a structure similar to the structure of the surface emitting laser element 100B. As shown in FIG. 21, when the current passing through region has a square shape (bY'/bX'=1.0), the difference of the radiation angles (radiation angle difference) between in the X and Y axes directions is 0.17°, and the cross sectional shape of the output laser beam is ellipsoidal. This is because the thickness of "Sy2'" is smaller than the thickness of "Sx1'" and the thickness of "Sx2'".

Figure 22:
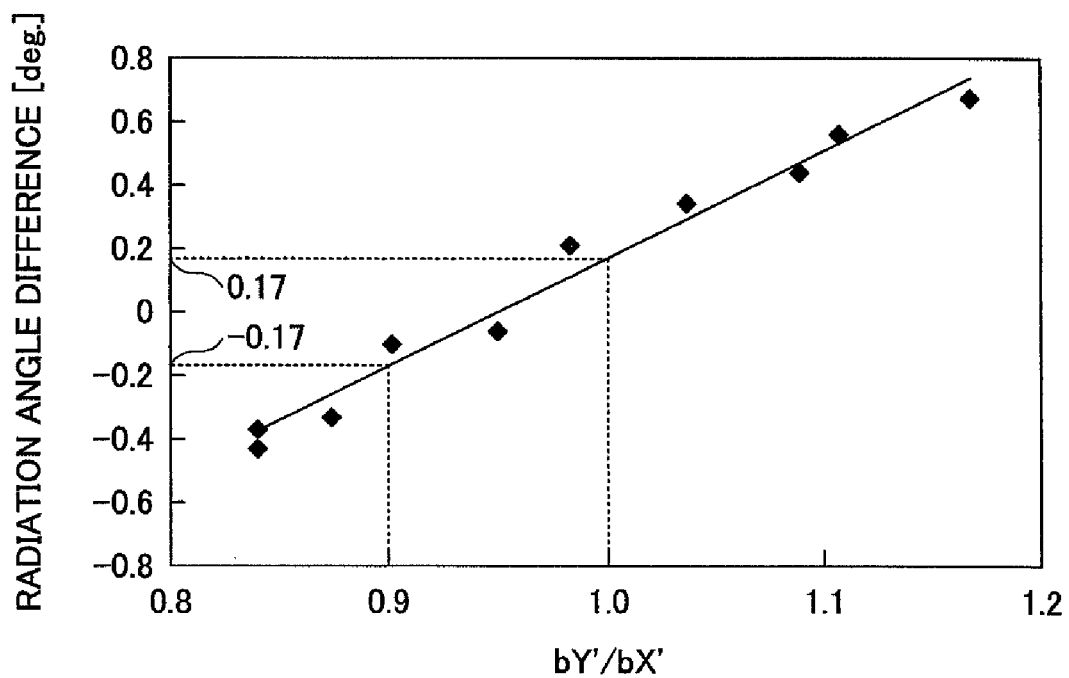
FIG. 22 is a graph showing a relationship between the rectangular ratio of the current passing through region and the radiation angle difference of a surface emitting laser element having a structure similar to the structure of the surface emitting laser element shown in FIG. 17.

FIG. 22 is a graph showing a relationship between the rectangular ratio of the current passing through region (bY'/bX') and the radiation angle difference of a surface emitting laser element having a structure similar to the structure of the surface emitting laser element 100B. As shown in FIG. 21, there is a linear correlation between the rectangular ratio of the current passing through region and the radiation angle difference. When the rectangular ratio of the current passing through region is 0.9 or more and less than 1.0, the radiation angle difference can be smaller than a case where the current passing through region has a square shape.

As described above, the inventors have found that the plane orientation dependency of the oxidation rate is different due to the thickness of the layer to be selectively oxidized under the same oxidation conditions.

In the above embodiment, the oscillation wavelength of the light emitting part is in the 780 nm band. However, the oscillation wavelength of the light emitting section can be changed corresponding to the characteristics of the photoconductor body (photoconductor drum).

In addition, the surface emitting laser element 100 (100A, 100B) can be used in an apparatus other than the image forming apparatus. In this case, the oscillation wavelength can be in a 650 nm band, a 850 nm band, a 980 nm band, a 1.3 µm band, a 1.5 µm band, and so on depending on the intended use.

Figure 23:
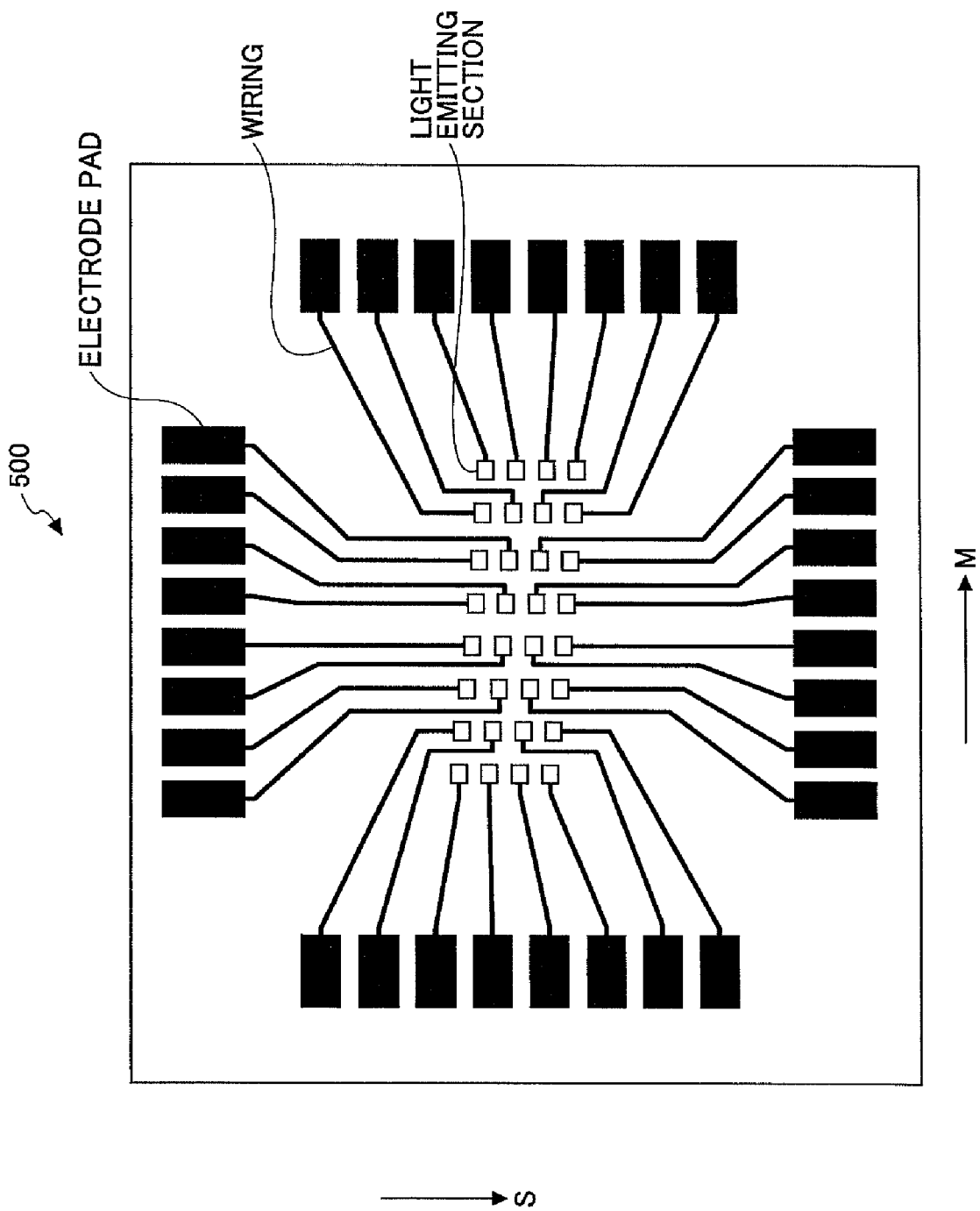
FIG. 23 is a diagram showing a surface emitting laser array according to the embodiment of the present invention.

FIG. 23 is a diagram showing a surface emitting laser array 500 according to the embodiment of the present invention.

The light source 14 in the optical scanning device 1010 shown in FIG. 2 can include the surface emitting laser array 500 shown in FIG. 23 instead of including the surface emitting laser element 100 (100A, 100B).

In the surface emitting laser array 500, plural light emitting sections are disposed on a substrate. In FIG. 23, 32 light emitting sections are disposed. In FIG. 23, the M direction is the main scanning corresponding direction and the S direction is the sub scanning corresponding direction. The number of the light emitting sections is not limited to 32, and can be less than 32 or more than 32.

Figure 24:
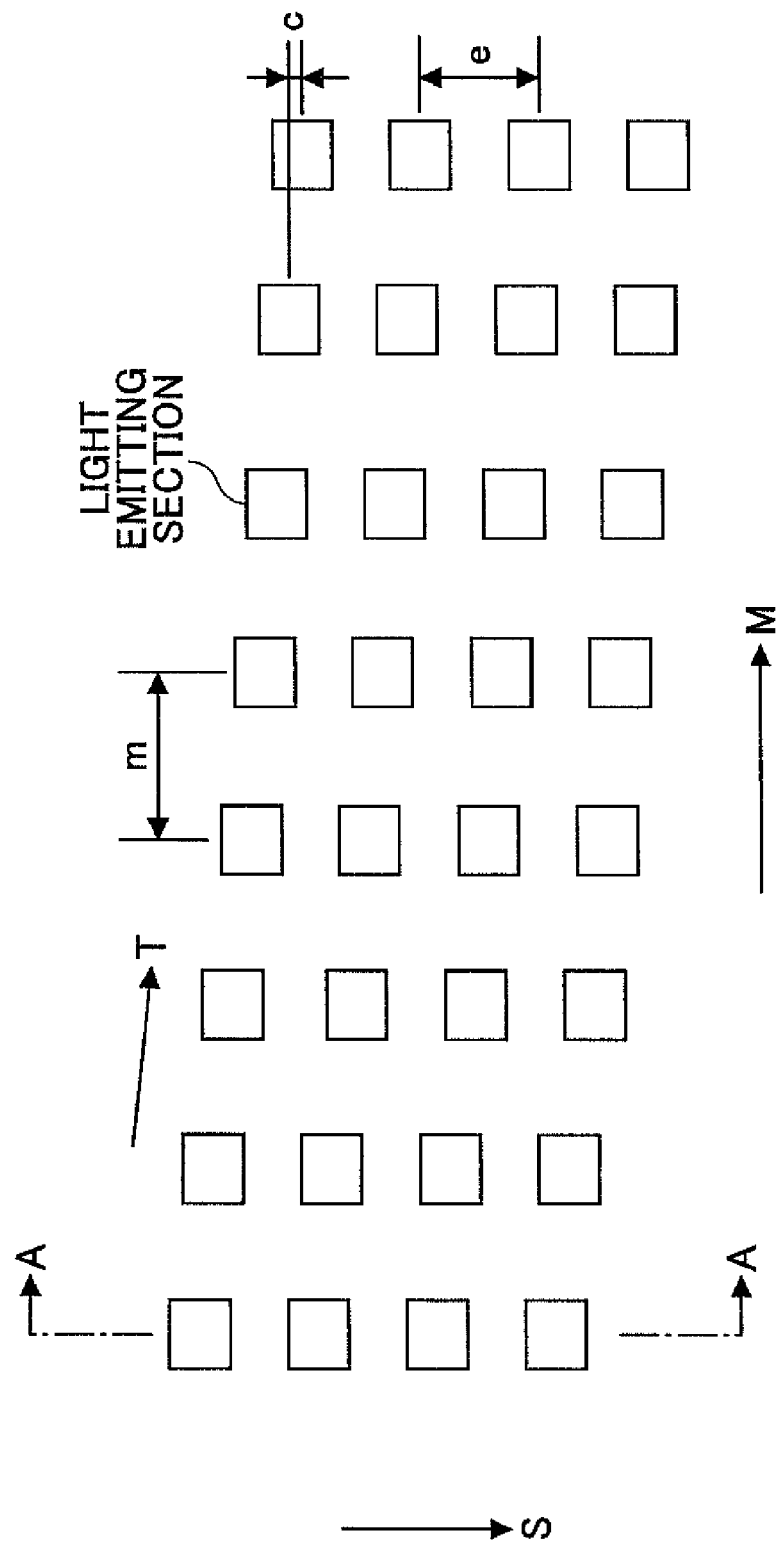
FIG. 24 is a diagram showing a two-dimensional array of light emitting sections shown in FIG. 23.
Figure 27B:
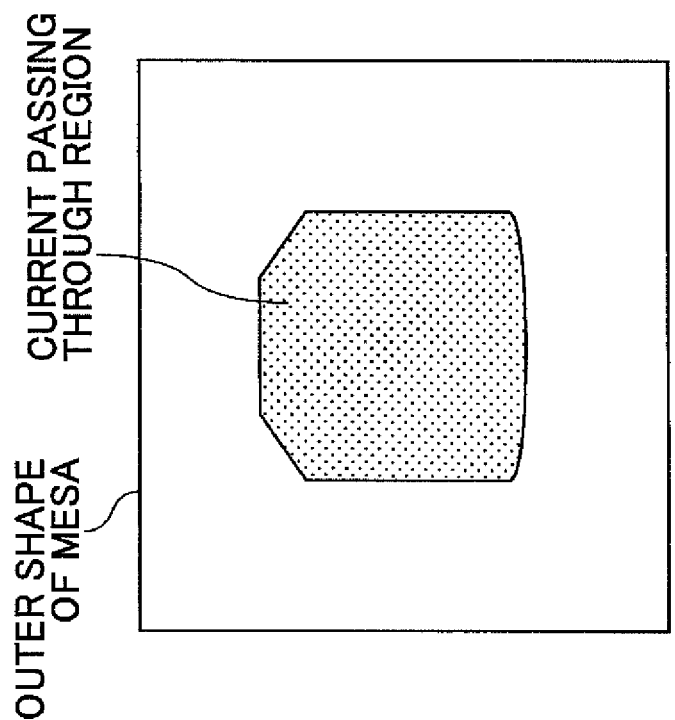
FIG. 27B is a diagram showing the outer shape of the mesa and a shape of a current passing through region which is symmetrical for two axes.
Figure 27A:
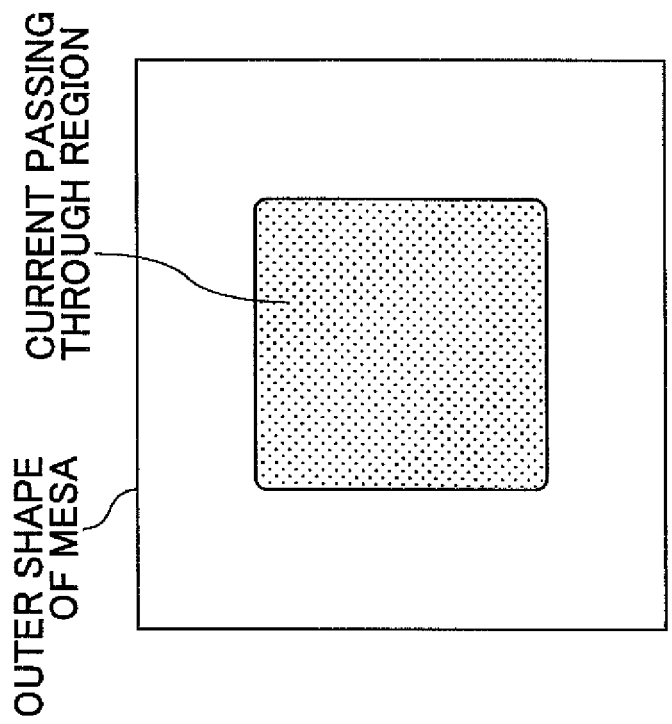
FIG. 27A is a diagram showing an outer shape of a mesa and a shape of a current passing through region.

FIG. 24 is a diagram showing a two-dimensional array of the light emitting sections shown in FIG. 23. As shown in FIG. 24, the surface emitting laser array 500 includes four light emitting section arrays in which eight light emitting sections are disposed with the same interval between the light emitting sections in the T direction having a tilt angle from the M direction toward the S direction. The eight light emitting sections in one array are disposed so that the interval in the S direction between the centers of the eight light emitting sections is "c" and the four light emitting section arrays are disposed so that the interval in the S direction between the four light emitting section arrays is "e" (distance between the centers of the two light emitting section arrays). That is, the 32 light emitting sections are two-dimensionally arrayed.

In FIG. 24, the interval "c" is 3 µm, the interval "e" is 24 µm, and the interval "m" between the light emitting sections in the M direction is 30 µm.

FIG. 25 is a cut-away side view along line A-A of FIG. 24. As shown in FIG. 25, the light emitting section is the same as the surface emitting laser element 100. That is, the surface emitting laser array 500 can be manufactured by a method similar to the manufacturing method of the surface emitting laser element 100.

The surface emitting laser array 500 is formed of the surface emitting laser elements 100. Therefore, the surface emitting laser array 500 can have the same effects as the effects of the surface emitting laser element 100.

In the surface emitting laser array 500, the interval "c" between the light emitting sections is constant when each of the light emitting sections is normally projected on a virtual line extending in the sub scanning corresponding direction; therefore, when light emitting timing of the light emitting sections is adjusted, it can be said that the light emitting sections are arrayed with the same interval on the photoconductor drum 1030 in the sub scanning direction.

In addition, since the interval "c" is 3 µm, when the magnification of the optical system of the optical scanning device 1010 is determined to be approximately 1.8 times, high density writing of 4800 dpi (dot per inch) can be performed. When the number of the light emitting sections is increased in the main scanning corresponding direction, an array arrangement is performed in which the interval "c" is further decreased by narrowing the interval "e", or the magnification of the optical system is decreased; further high density writing can be performed, and higher quality printing can be performed. In this, the writing interval in the main scanning direction can be easily controlled by adjusting the light emitting timing of the light emitting sections.

In this case, in the laser printer 1000, even if the writing dot density is increased, the printing can be performed without decreasing the printing speed. In addition, when the writing dot density is not changed, the printing speed can be further increased.

In addition, in this case, the polarization directions of the laser beams (light fluxes) from the light emitting sections are stable and equal; therefore, the laser printer 1000 can stably form a high quality image.

In the surface emitting laser array 500, the distance (groove) between the two adjacent light emitting sections (the surface emitting laser elements 100) is preferably 5 µm or more so that the light emitting sections are electrically and spatially separated from each other. When the distance is too small, etching is not easily controlled when the surface emitting laser array 500 is manufactured. In addition, the size of the mesa (the length of one side) is preferably 10 µm or more. When the length is too short, heat stays inside the surface emitting array 500 and the characteristics may be lowered.

In addition, in the surface emitting laser array 500, the surface emitting laser elements 100A or 100B can be used instead of using the surface emitting laser elements 100.

In addition, in a surface emitting laser array, the surface emitting laser elements 100 (100A, 100B) can be arrayed one-dimensionally.

In addition, the normal direction of the mirror polished surface (principal surface) of the substrate 101 (201, 301) is inclined by 15 degrees to the [1 1 1] crystal orientation A direction relative to the [1 0 0] crystal orientation direction. However, the normal direction of the mirror polished surface (principal surface) of the substrate 101 (201, 301) can be inclined by a degree other than 15 degrees in the [1 1 1] crystal orientation A direction relative to the [1 0 0] crystal orientation direction.

In the present embodiment, the case is described in which the mesa rectangular ratio is 0.992. However, as described above, when the mesa rectangular ratio is more than 0.988 and less than 1.014, the radiation angle of the output laser beam can be smaller than the case where the current passing through region has a square.

In addition, in the present embodiment, as the image forming apparatus, the laser printer 1000 is used; however, the image forming apparatus is not limited to the laser printer 1000, and can be an image forming apparatus including the optical scanning device 1010.

For example, in the present embodiment, as the image forming apparatus, an image forming apparatus can be used in which laser beams indicating corresponding colors are directly radiated onto a recording medium.

In addition, in the present embodiment, as the image forming apparatus, an image forming apparatus can be used in which a silver salt film is used as an image carrier. In this case, a latent image is formed on the silver salt film by optical scanning, and the latent image can be visualized by a developing process of a normal silver salt photographic process. Further, the visible image can be transferred onto photographic printing paper by a printing process of the normal silver salt photographic process. The image forming apparatus can be used as an optical reproduction apparatus or an optical image forming apparatus which shows a CT (computerized tomography) scanned image and so on.

In addition, as shown in FIG. 26, as the image forming apparatus, a color printer 2000 having plural photoconductor drums can be used. FIG. 26 is a cut-away side view of the color printer 2000.

The color printer 2000 is a tandem type multiple color printer which forms a full color image by superposing four color images (black, cyan, magenta, and yellow images). The color printer 2000 includes a photoconductor drum K1, a charging device K2, a developing device K4, a cleaning unit K5, and a transfer device K6 for a black image; a photoconductor drum C1, a charging device C2, a developing device C4, a cleaning unit C5, and a transfer device C6 for a cyan image; a photoconductor drum M1, a charging device M2, a developing device M4, a cleaning unit M5, and a transfer device M6 for a magenta image; a photoconductor drum Y1, a charging device Y2, a developing device Y4, a cleaning unit Y5, and a transfer device Y6 for a yellow image; an optical scanning device 2010, a transfer belt 2080, a fixing unit 2030, and so on.

In the following, since the operations of the elements are the same in the four color images, the operations of the black image are described as representative.

The photoconductor drum K1 is rotated in the arrow direction shown in FIG. 26. The charging device K2, the developing device K4, the transfer device K6, and the cleaning unit K5 are sequentially disposed to surround the photoconductor drum K1 along the rotational direction of the photoconductor drum K1. The charging device K2 uniformly charges the surface of the photoconductor drum K1. The optical scanning device 2010 radiates light beams onto the surface of the photoconductor drum K1 charged by the charging device K2. With this, an electrostatic latent image is formed on the surface of the photoconductor drum K1. The developing device K4 develops the electrostatic latent image and forms a toner image on the surface of the photoconductor drum K1. The transfer device K6 transfers the toner image onto a recording medium (paper) on a transfer belt 2080, and the transferred image is fixed by the fixing unit 2030. When the above operations are performed for all color images, a full color image is printed on the recording medium.

The optical scanning device 2010 includes a light source similar to the light source 14 in each color. Therefore, the optical scanning device 2010 can obtain the same effects as those of the optical scanning device 1010. In addition, since the color printer 2000 includes the optical scanning device 2010, the color printer 2000 can obtain the same effects as those of the laser printer 1000.

In the color printer 2000, a color registration error may be generated due to a manufacturing error of each component and a positioning error of the component. However, in a case where each of the light sources of the optical scanning device 2010 includes a surface emitting laser array similar to the surface emitting laser array 500, when a light emitting section to be lighted is selected, the color registration error can be decreased.

As described above, according to the embodiment of the present invention, in the surface emitting laser element 100 (100A, 100B) and the surface emitting laser array 500, the stability of the output laser beam in the polarization direction can be high and the cross sectional shape of the output laser beam can be approximately ellipsoidal without causing high cost. In addition, in the optical scanning device 1010 (2010), accurate optical scanning can be performed without causing high cost. In addition, the image forming apparatus 1000 (2000) can form a high quality image without causing high cost.

Further, the present invention is not limited to the specifically disclosed embodiment, and variations and modifications may be made without departing from the scope of the present invention.

The present invention is based on Japanese Priority Patent Application No. 2008-128303, filed on May 15, 2008, and Japanese Priority Patent Application No. 2009-081664, filed on Mar. 30, 2009, with the Japanese Patent Office, the entire contents of which are hereby incorporated herein by reference.

What is claimed is:

1. A surface emitting laser element which emits a laser beam in a direction perpendicular to a surface of a substrate of the surface emitting laser element, wherein
   a normal direction of a principal surface of the substrate is inclined to one direction of a [1 1 1] crystal orientation relative to one direction of a [1 0 0] crystal orientation, and
   the surface emitting laser element includes:
      a resonator structural body including an active layer;
      first and second semiconductor distributed Bragg reflectors which sandwich the resonator structural body and include a confinement structure in which a current passing through region is surrounded by an oxidized layer formed by oxidizing a part of a layer to be selectively oxidized containing at least aluminum; and
      a plurality of semiconductor layers stacked on the substrate, wherein
   a shape of the current passing through region is symmetrical to a first axis which is orthogonal to one direction of the [1 0 0] crystal orientation and one direction of the [1 1 1] crystal orientation, is parallel to the surface of the substrate, and passes through a center of the current passing through region; and is symmetrical to a second axis which is orthogonal to the normal direction and the first axis and passes through the center of the current passing through region;
   a length of the current passing through region in the first axis direction is different from a length in the second axis direction;
   a thickness of the oxidized layer surrounding the current passing through region is different between in a direction parallel to the second axis direction and in a direction parallel to the first axis direction; and
   a radiation angle of the laser beam in the first axis direction is the same as a radiation angle of the laser beam in the second axis direction.

2. The surface emitting laser element as claimed in claim 1, wherein:
   a length of the current passing through region in the second axis direction is greater than a length of the current passing through region in the first axis direction; and the thickness of the oxidized layer surrounding the current passing through region is greater in one of the directions parallel to the second axis than in the direction parallel to the first axis.

3. The surface emitting laser element as claimed in claim 2, wherein:

the plural semiconductor layers have a mesa shape in which at least a side of the layer to be selectively oxidized is exposed by etching; and when the length of the mesa shape in the first axis direction is determined to be "1", the length of the mesa shape in the second axis direction is 0.988 or more and 1.014 or less.

4. The surface emitting laser element as claimed in claim 1, wherein:

the normal direction of the principal surface of the substrate is inclined to the [1 1 1] crystal orientation direction relative to the [1 0 0] crystal orientation direction; and the direction parallel to the first axis direction is the [0 −1 1] crystal orientation direction and the [0 1 −1] crystal orientation direction.

5. The surface emitting laser element as claimed in claim 4, wherein:

when the length of the current passing region in the first axis direction is determined to be "1", the length of the current passing region in the second axis direction is more than "1" and less than "1.17".

6. The surface emitting laser element as claimed in claim 1, wherein:

the length of the current passing region is smaller in the second axis direction than in the first axis direction; and the thickness of the oxidized layer surrounding the current passing through region is greater in one of the directions parallel to the second axis direction than in the direction parallel to the first axis direction.

7. The surface emitting laser element as claimed in claim 1, wherein:

when the length of the current passing region in the first axis direction is determined to be "1", the length of the current passing region in the second axis direction is less than "1" and 0.90 or more.

8. The surface emitting laser element as claimed in claim 1, wherein:

the second axis direction is a polarization direction of the output laser beam.

9. The surface emitting laser element as claimed in claim 1, wherein:

the first axis direction is a polarization direction of the output laser beam.

10. A surface emitting laser array, comprising:

a plurality of the surface emitting laser elements as claimed in claim 1.

11. An optical scanning device which scans a surface to be scanned by a laser beam, comprising:

a light source which includes the surface emitting laser array as claimed in claim 10;

a deflecting unit which deflects the laser beam from the light source; and a scanning optical system which condenses the laser beam deflected by the deflecting unit onto the surface to be scanned.

12. An optical scanning device which scans a surface to be scanned by a laser beam, comprising:

a light source which includes a surface emitting laser element configured to emit a laser beam in a direction perpendicular to a surface of a substrate of the surface emitting laser element, a normal direction of a principal surface of the substrate being inclined to one direction of a [1 1 1] crystal orientation relative to one direction of a [1 0 0] crystal orientation, the surface emitting laser element including a resonator structural body including an active layer, first and second semiconductor distributed Bragg reflectors which sandwich the resonator structural body and include a confinement structure in which a current passing through region is surrounded by an oxidized layer formed by oxidizing a part of a layer to be selectively oxidized containing at least aluminum, and a plurality of semiconductor layers stacked on the substrate;

a deflecting unit which deflects the laser beam from the light source; and a scanning optical system which condenses the laser beam deflected by the deflecting unit onto the surface to be scanned, wherein in the confinement structure in which the current passing through region is surrounded by the oxidized layer a shape of the current passing through region is symmetrical to a first axis which is orthogonal to one direction of the [1 0 0] crystal orientation and one direction of the [1 1 1] crystal orientation, is parallel to the surface of the substrate, and passes through a center of the current passing through region; and is symmetrical to a second axis which is orthogonal to the normal direction and the first axis and passes through the center of the current passing through region, a length of the current passing through region in the first axis direction is different from a length in the second axis direction, a thickness of the oxidized layer surrounding the current passing through region is different between in a direction parallel to the second axis direction and in a direction parallel to the first axis direction, and a radiation angle of the laser beam in the first axis direction is the same as a radiation angle of the laser beam in the second axis direction.

13. An image forming apparatus, comprising:

at least one image carrier; and at least one of the optical scanning devices as claimed in claim 12 which scans the laser beam including image information onto the image carrier.

14. The image forming apparatus as claimed in claim 13, wherein:

the image information is multiple color image information.

* * * * *